(12) United States Patent
Smith

(10) Patent No.: US 11,427,224 B2
(45) Date of Patent: Aug. 30, 2022

(54) SYSTEMS AND METHODS FOR VEHICLE FLOCKING FOR IMPROVED SAFETY AND TRAFFIC OPTIMIZATION

(71) Applicant: CEO Vision, Inc, Cary, NC (US)

(72) Inventor: David A. Smith, Cary, NC (US)

(73) Assignee: CEO Vision, Inc, Cary, NC (US)

( * ) Notice: Subject to any disclaimer, the term of this patent is extended or adjusted under 35 U.S.C. 154(b) by 30 days.

(21) Appl. No.: 16/885,057

(22) Filed: May 27, 2020

(65) Prior Publication Data

US 2020/0377123 A1 Dec. 3, 2020

Related U.S. Application Data

(63) Continuation-in-part of application No. 16/883,804, filed on May 26, 2020.
(Continued)

(51) Int. Cl.
*B60W 60/00* (2020.01)
*G06F 30/27* (2020.01)
(Continued)

(52) U.S. Cl.
CPC ......... *B60W 60/0025* (2020.02); *G06F 30/27* (2020.01); *G06F 30/28* (2020.01);
(Continued)

(58) Field of Classification Search
CPC ......... B60W 60/0025; B60W 2554/80; B60W 2420/42; B60W 2552/00; B60W 2555/20;
(Continued)

(56) References Cited

U.S. PATENT DOCUMENTS

2009/0018761 A1* 1/2009 Petrisor .................. G08G 1/017
701/118
2012/0271944 A1 10/2012 Turner et al.
(Continued)

OTHER PUBLICATIONS

ISA/US, "Notification of Transmittal of the ISR and the Written Opinion of the International Searching Authority, or the Declaration," in PCT Application No. PCT/US2020/034986 dated Oct. 27, 2020, 13 pages.

*Primary Examiner* — Kibrom T Hailu
*Assistant Examiner* — Nizam U Ahmed
(74) *Attorney, Agent, or Firm* — Kang S. Lim

(57) ABSTRACT

Systems and methods for generating a virtual environment in a flock of vehicles are provided. In this method a reflector is utilized to define a coverage area. Sensory data from autonomous vehicles within this coverage area is collected, along with non-vehicle data. Then a virtual environment may be replicated using the data at a local computational device on each of the vehicles via the transmission of messages through the reflector. Each vehicle can use this data to make decisions regarding movements, as well as having the traffic patterns optimized based upon an objective. When traffic flow is being optimized it is also possible to assign weights to the vehicles to provide them preferential treatment in the traffic flow model. The traffic flow model that is generated may be a fluid dynamics model, or may be based upon deep learning techniques. The objective for the model is generally to maximize total vehicle throughput in order to reduce overall traffic congestion.

10 Claims, 21 Drawing Sheets

Related U.S. Application Data

(60) Provisional application No. 62/988,781, filed on Mar. 12, 2020, provisional application No. 62/854,232, filed on May 29, 2019.

(51) Int. Cl.
*G06F 30/28* (2020.01)
*G08G 1/00* (2006.01)

(52) U.S. Cl.
CPC .............. *G08G 1/20* (2013.01); *G08G 1/22* (2013.01); *B60W 2420/42* (2013.01); *B60W 2420/52* (2013.01); *B60W 2520/105* (2013.01); *B60W 2552/00* (2020.02); *B60W 2554/80* (2020.02); *B60W 2555/20* (2020.02)

(58) Field of Classification Search
CPC ....... B60W 2520/105; B60W 2420/52; B60W 2554/00; G06F 30/27; G06F 30/28; G08G 1/22; G08G 1/20; G08G 1/096783; G08G 1/0112; G08G 1/0145; H04W 4/38; H04W 4/44; H04L 67/20; H04L 67/22; H04L 67/1095; H04L 67/18; H04L 67/12
USPC ......................................................... 370/503
See application file for complete search history.

(56) References Cited

U.S. PATENT DOCUMENTS

| | | |
|---|---|---|
| 2016/0041728 A1 | 2/2016 | Dempski et al. |
| 2017/0318360 A1* | 11/2017 | Tran ........................ B33Y 80/00 |
| 2018/0191867 A1 | 7/2018 | Siebel et al. |
| 2019/0132709 A1* | 5/2019 | Graefe ..................... H04W 4/38 |
| 2020/0294401 A1* | 9/2020 | Kerecsen .............. G05D 1/0287 |

* cited by examiner

SYSTEMS AND METHODS FOR VEHICLE FLOCKING FOR IMPROVED SAFETY AND TRAFFIC OPTIMIZATION

CROSS REFERENCE TO RELATED APPLICATIONS

This non-provisional application claims the benefit of provisional application No. 62/988,781, filed Mar. 12, 2020, of the same title.

This continuation-in-part application is a non-provisional and claims the benefit of U.S. non-provisional application Ser. No. 16/883,804 filed May 26, 2020 entitled "Systems and Methods for Secure, Low Bandwidth Replicated Virtual Worlds for Shared Space Computing, which claims the benefit of provisional application No. 62/854,232, filed May 29, 2019, of the same title.

All of the above-referenced applications are incorporated herein in their entirety by this reference.

BACKGROUND

The present invention relates to systems and methods for vehicle flocking utilizing a computing architecture focused on deep collaboration inside a 3D shared space. Such systems and methods allow for improved vehicle safety, and improvements in traffic optimization.

With the rise in automated vehicles, and a desire for more safety conscious manually driven vehicles, there has been a significant increase in the number and complexity of sensors located in each vehicle. This data is utilized for collision avoidance, traction control, "smart" cruise control features, and ultimately for fully automated driving. However, there are limitations on the sensory data collected by each vehicle, resulting in the need for expensive redundant systems, and the operation of vehicles in a very conservative manner.

Often this conservative driving results in the vehicle operating very cautiously and slowly, which is beneficial for safety, but may be annoying for passengers. Likewise, for non-autonomous vehicles, even when operating under advanced features, such as cruise control which tracks the spacing of other vehicles, there is a need for constant human vigilance. Lastly, as with current manually driven vehicles, each car or truck operates individually. Individual operation of vehicles results in increased safety risks, even when a "defensive driving" techniques are employed. Additionally, individual operation of vehicles results in increased traffic congestion.

A few approaches have been taken to resolve these deficiencies. For example, the concept of truck convoys, where a series of trucks are linked together, has been tested. In these convoys, the lead truck is often driven by a human operator, and the actions of the lead truck are provided to the following trucks. These following trucks can take actions that mimic the lead truck, in near real time, allowing for the truck convoy to remain very close to one another. This has the advantage of "drafting" thereby reducing drag and increasing vehicle gas economy. Additionally, by effectively making a truck "train" the traffic congestion can be marginally reduced. However, there is a significant safety risk in chaining together multiple trucks, as a collision could be catastrophic. As such, truck convoys have not been widely adopted.

Another proposed solution is to locate transponders on vehicles such that collisions may be reduced. While this may result in increased safety, without widespread adoption the benefits are minimal. Further, such systems provide no alleviation of traffic congestion.

Lastly, there are mapping applications that provide information related to traffic conditions, as well as accident or hazard conditions, to benefit a human driver. These mapping applications may suggest alternate routes that may result in overall traffic relief, and having information regarding hazards could, theoretically, improve safety. However, in reality, these systems are empirically distracting, and have been shown to decrease safety. Furthermore, they rely upon human interaction and interpretation.

It is therefore apparent that an urgent need exists for a new systems and methodologies that enable vehicle flocking activity. Such systems and methods would result in significantly improved safety and optimization of traffic congestion and travel times.

SUMMARY

To achieve the foregoing and in accordance with the present invention, systems and methods for vehicle flocking are provided. Such systems and methods enable increased safety and improvements in traffic conditions.

In some embodiments, a method for generating a virtual environment in a flock of vehicles is provided. In this method a reflector is utilized to define a coverage area. The reflector may be co-located with a cellular tower. Sensory data from autonomous vehicles within this coverage area is collected, along with non-vehicle data. The sensory data includes radar, LiDAR and optical sensory data, as well as vehicle data that includes position, speed and acceleration of each of the vehicles. The non-vehicle data includes at least one of road condition data, weather data, time of day, accident data, construction data and event data.

Then a virtual environment may be replicated using the collected sensory data and non-vehicle data at a local computational device on each of the vehicles via the transmission of messages through the reflector. The sensory data from each of the autonomous vehicles is used to generate objects within the virtual environment. The objects are characterized by their position, shape, speed and acceleration. Computations are mirrored on each of the objects across the local computational devices deterministically.

Each vehicle can use this data to make decisions regarding movements, as well as having the traffic patterns optimized based upon an objective. When traffic flow is being optimized it is also possible to assign weights to the vehicles to provide them preferential treatment in the traffic flow model. Generally these weights may be equal, but some situations like emergency vehicles, high occupancy vehicle, fee based vehicle (similar to an express tag), and a credit based vehicle, may be assigned a higher weight.

The traffic flow model that is generated may be a fluid dynamics model, or may be based upon deep learning techniques. The objective for the model is generally to maximize total vehicle throughput in order to reduce overall traffic congestion.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which.

DETAILED DESCRIPTION

Figure 1:
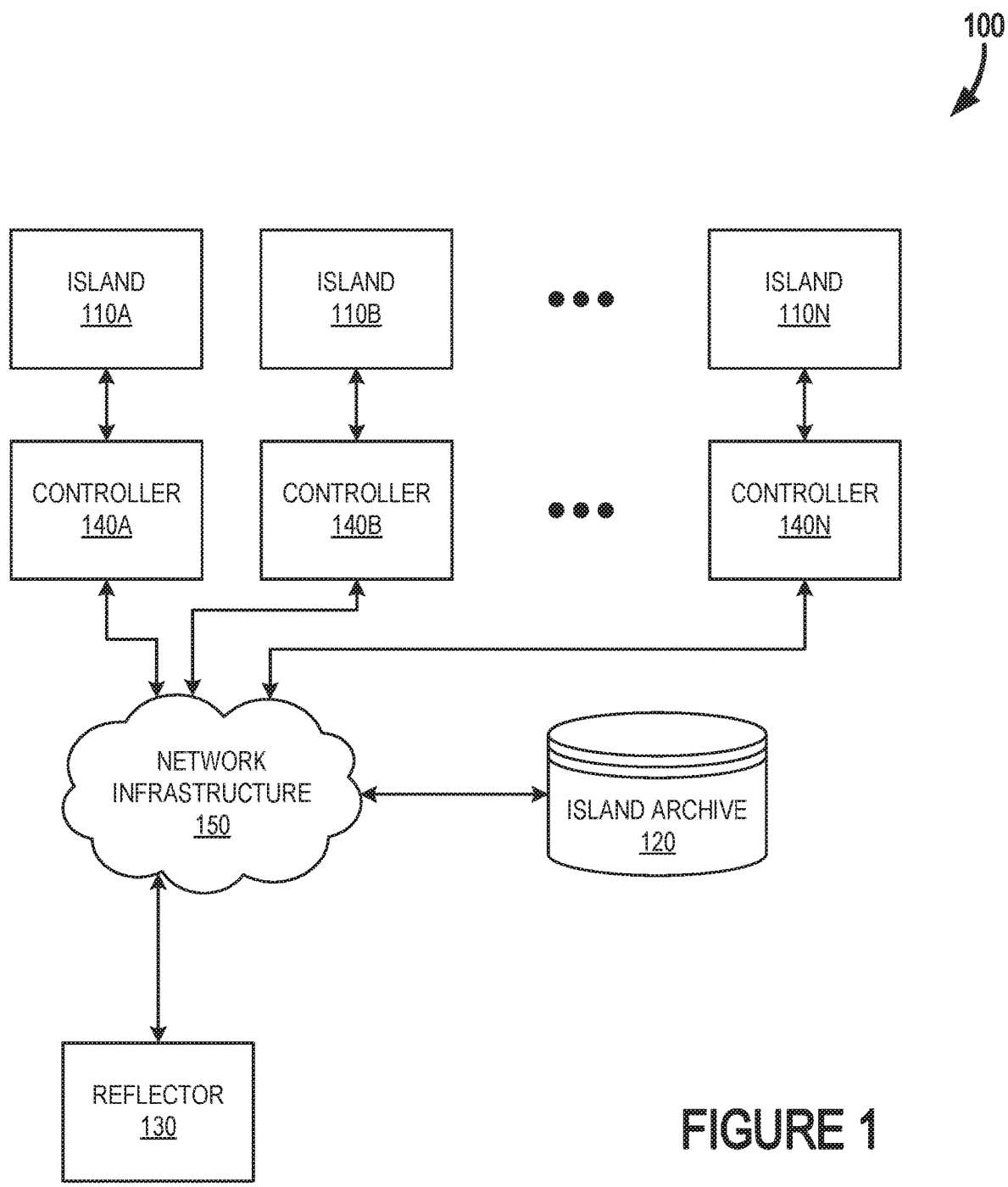
FIG. 1 is an example logical diagram of a system for a shared virtual environment, in accordance with some embodiments.

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "will," "will not," "shall," "shall not," "must," "must not," "first," "initially," "next," "subsequently," "before," "after," "lastly," and "finally," are not meant to limit the scope of the present invention as the embodiments disclosed herein are merely exemplary.

The following description of some embodiments will be provided in relation to numerous subsections. The use of subsections, with headings, is intended to provide greater clarity and structure to the present invention. In no way are the subsections intended to limit or constrain the disclosure contained therein. Thus, disclosures in any one section are intended to apply to all other sections, as is applicable.

Fundamental to vehicle flocking is the concept of a shred three dimensional space that various vehicles (both autonomous and those with sensory capabilities) can share. This collection of vehicles are known as a "flock" and as they share a virtualized representation of the surrounding environment, may make better safety decisions (including predictive safety models), as well as operate as a collective group rather than as disconnected individuals. This group behavior allows for optimizations for specific goals to be made, resulting in significantly more efficient traffic flow.

Many of the operating systems that are still being used were fundamentally designed thirty years ago, when the internet was nascent, and computing hardware was orders of magnitude less powerful than the hardware available today. The operating systems of the day were thus designed around these features: 1) each device was presumed to be fundamentally alone, and segregated from other devices, and 2) computational burdens were things to be minimized at all cost.

What resulted were operating systems that were non-portable, locked into specific environments that included a number of limitations to reduce computational overhead. Further, late bound programming languages, such as LISP and Smalltalk, were frowned upon due to their relatively slow speeds.

Since then, however, there has been an explosive increase in processing speeds, and graphical processor speeds in particular, which is underutilized by most current operating systems. The increased processing speeds have also made late bound languages viable for more real time applications than was previously possible. Further, the omnipresence of reliable and fast broadband internet (and in the near future 5G cellular service) illustrates the shortcomings of the traditional operating systems in terms of their portability and share-ability across user groups. This limitation is of particular concern when it comes to vehicles needing to share a three dimensional virtual abstraction of the surrounding environment in essentially real time.

Applications exist that allow for some of this functionality, but these existing systems are required to operate within the confines of legacy operating systems, resulting in a number of limitations. Generally these application based approaches scale badly when involving very large numbers of users/vehicles. One of the reasons for this is the very large bandwidth requirements required by such systems (especially when relying upon cellular signal, as a vehicle flock does). Traditionally, the shared environments are computed at a central server and renderings of the environment are provided to each end user. This requires a significant transfer of data to each user, resulting in bandwidth limitations.

Another hurdle for these traditional approaches is the client/server cost and complexity involved in developing and maintaining these simulations. Again, since the simulation/environment is centrally computed, the server side computing requirements expand exponentially as additional users are involved. Thus costs for the server end can rapidly spiral out of reach of many developers, and are difficult to deploy in a distributed fashion throughout a city or other environment. Likewise, there is introduced a single point of failure, which must be managed by intermittent outages, or an equally expensive redundancy system to avoid unwanted down time. Failure of such a mission critical system can result in injury or death, making traditional approaches exceptionally risky.

A final hurdle of these traditional shared space applications is the high degree of latency involved. Server side and user interaction latency dramatically limits a user's experience, resulting in virtually unusable remote rendering for applications, such as driving, where milliseconds of latency may have an impact on safety.

As noted, the following systems and methods are for a highly collaborative three-dimensional shared environment that enable vehicle flocking. Such environments are low latency, low bandwidth and nearly infinitely scalable without the high expense associated with server driven architectures. Further, these environments, through the reflection of messages between the various local machines embodied in each vehicle involved in the shared space, offers perfect environment fidelity that is ideally suited to massive multi-user mobile use cases where perfect fidelity is a requirement.

I. Shared Environment Overview

As noted previously, traditional sharing of environments involves a centralized server model where the "world" is computed on a backend server, rendered in the central server, and renderings are delivered to the individual users via the internet. Such systems essentially "live stream" a video feed from the backend system, and suffer significantly from bandwidth concerns, latency, and extreme server related costs (e.g., limited scalability).

In other traditional systems, the world is still computed on the backend server device, but here updates to the world are then sent to the clients which in turn locally render the view that is presented to the user. While still bandwidth intensive, and costly in terms of backend server requirements, such systems have a marginal improvement over a centrally rendered system in regards to these issues. However, latency can be a significant issue for this type of system, as well as a reduction in fidelity between the users' views. In a vehicle setting, latency, and especially differences in the virtual environment between vehicles, can cause accidents or other safety concerns.

The present disclosure focuses on a new approach to a shared virtual environment that allows for vehicle flocking. In this architecture inputs are bound to, and sorted by, a lightweight reflector (either located in a cellular base station, in a vehicle, or otherwise distributed around an environment) that guarantees that all copies of the world stay in bit perfect synchronization. In turn, rather than having a central server computing the 'world' local machines in the vehicles independently administer to their perfect fidelity copy of the shared 'world'. Computations are locally performed, and the messaging to ensure that each world copy is synchronized yet require minimal bandwidth requirements.

These systems and methods provide for a minimal server footprint, with virtually no server compute costs. Likewise, there is no server code required: the clients define the environment, and the reflector servers function only in a time-keeping manner. This decentralized operation allows for the system to be any size and distributed wherever it is desired (including on edge systems as needed for vehicle flocks). Latencies are minimized significantly below the current methodologies, and bandwidths are likewise a fraction of what a current shared environment requires.

Additionally, by not relying on a centralized backend server, there can be near instant server migrations allowing for latency improvements, or for when a vehicle needs to join a new flock "cell". Indeed, security and privacy are a built in feature of these systems and methods, as will be discussed in greater detail below.

In order to more clearly describe the architecture enabling these shared environments, attention will now be turned to definitions that will assist in understanding the attendant figures and descriptions. The present architecture relies upon "objects" that are located within the "islands" running on each local computer in each vehicle. These 'objects' each include a state and a behavior. Objects in this context are representations of the actual physical objects in the actual environment around the vehicles. An object can publish events, subscribe to events, and request future events. An object lives in a "domain" which is an abstraction of the environment within the cell. The domain assigns an ID to each of its objects, and manages their subscriptions. An object may have "parts". Part IDs are managed by the object. The object itself is a part, too. In some embodiments, an object and its parts can be addressed using a hierarchical URL scheme.

A shared domain (a.k.a. "island") contains "model" objects. An island has an internal clock that only advances when receiving external timestamped events. Future events generated on the island are relative to the island's internal clock. Much of the following discussion will focus on these shared domain islands.

Objects within the same domain may communicate directly (e.g., by method calls), or by publishing of and subscribing to events. Objects in different domains can only communicate via "events". Publishing an event informs the objects subscribed to that event. The publishing object may attach data that is sent along with the event. Publishing an event has no side-effects on the publishing object: there is no observable difference in behavior whether there are subscribers to that event or not.

Subscribing to an event means to register a handler to be invoked when that event is published. If the publishing object attached data to the event, the handler will receive that data when invoked. The handler typically is a method of the subscribing object, the data is passed as an argument.

Events are published to a "scope". The scope can be an arbitrary string, but typically is the URL of an object or part, in some embodiments. When subscribing to an event, a scope needs to be specified, too. Only events published to that scope will cause that subscriber's registered handler to be invoked.

When subscribing to a shared domain's events, that domain's objects, their subscriptions, and future event requests (collectively called an island) are replicated to the user's machine. That means, a snapshot is taken of the current state of the island, which is sent via the internet to the user, and the island is recreated from the snapshot. To further facilitate the discussion, FIG. 1 provides an example logical diagram of a system for such a shared virtual environment 100, in accordance with some embodiments. Here there are a series of shared domain islands 110a-n each coupled to one or more controllers 140a-n a reflector 130 and an island archive 120 via a central network infrastructure 150. Islands 110a-n can be easily saved in the island archive 120 database. Likewise, islands may be readily duplicated between different computational devices, such as when a new vehicle enters a flock. For avoidance of doubt, throughout this discussion a vehicle is assumed to have a computational device or components within it that is a local machine. Particularly autonomous vehicles require significant computational power, and may readily host a local machine for maintaining the shared environment (abstraction of the surrounding real world environment).

The network 150 is depicted as a network cloud and as such is representative of a wide variety of telecommunications networks, for instance the World Wide Web, the internet, secure data networks, cellular networks, direct radio signaling, satellite transmission, or through any combination thereof. For vehicle flocking, obviously the connection between the vehicle local machines and the reflector is necessarily wireless. As such, a cellular signal may be particularly adapted to the specific use case.

The reflector 130 plays two major roles. First, it acts as the clock for the replicated islands in that it determines when an external event will be executed, as will be discussed in greater detail below. These external events are the only information an island 110a-n has about the actual passage of time, so the island 110a-n simply cannot execute any pending messages in its message queue until it receives one of these time-stamped external messages. The second critical role played by the reflector 130 is to forward any messages it receives from a particular controller 140 to all of the currently registered islands 110a-n. Reflectors 130 can be located almost anywhere on the network and need not be collocated with a particular island 110a-n. As will be discussed in greater detail below, reflectors may be ideally located within a vehicle, or collocated at a cellular base station, although other distributed reflector positions are likewise possible.

The controller 140a-n is the non-replicated part of the island/controller pair. While the controller 140a-n and each island 110a-n are shown separate in this example diagram, it is entirely possible these two components are functionally co-located within a single local computational device. The role of the controller 140a-n is to act as the interface between the island 110a-n and the reflector 130 and between the other vehicle software and the island. Its main job is to ship messages around between the other parts of the system. The controller 140a-n also manages the island's message queue, by determining when messages will get executed, as will be described in greater detail below. In some embodiments, a controller 140 can exist without an island 110a-n, acting as a proto-island until the real island is either created or duplicated. In this case it is used to maintain the message queue until either a new island is created or until an existing island is replicated.

Figure 2:
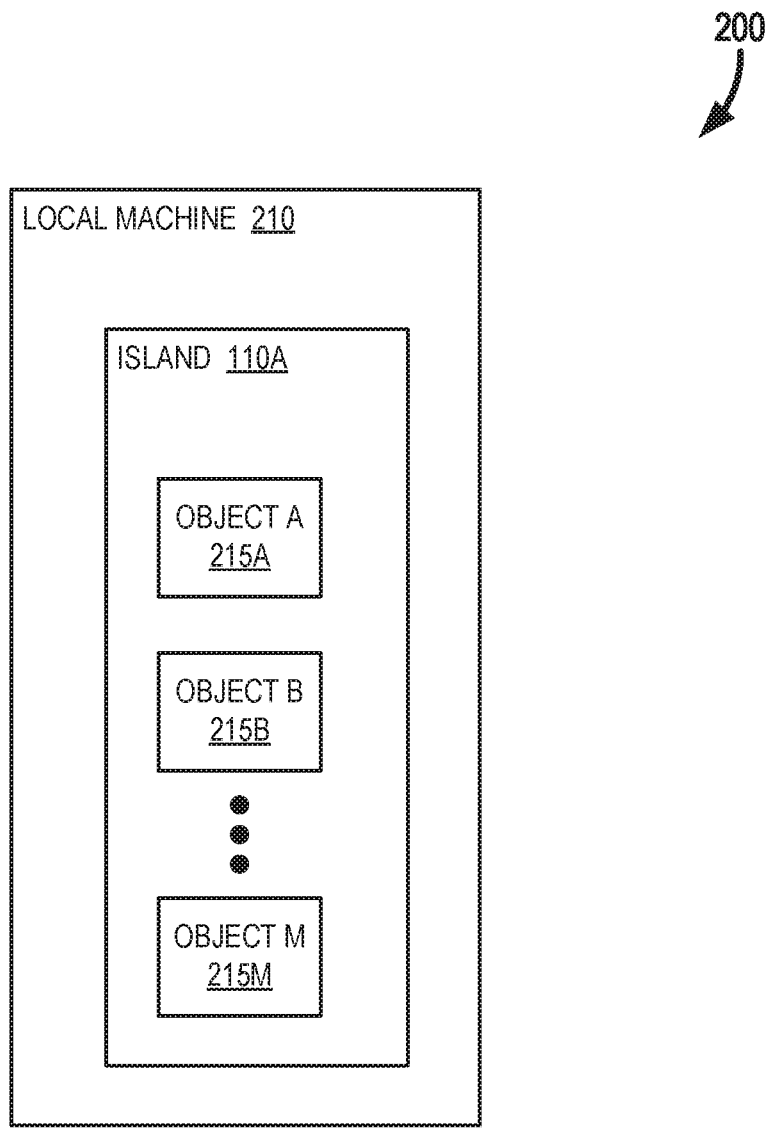
FIG. 2 is an example logical diagram of local machine embodies in a vehicle, in accordance with some embodiments.

Turning to FIG. 2, an example illustration is provided of the local machine 210 which is embodying the local island 110a. Within each island 110a-n are a series of objects 215a-m. As discussed, objects 215a-m include a state and a behavior, may include parts, and can publish events, subscribe to events, and request future events. These objects indicate other vehicles, people and other physical features of the actual environment around the flock.

Each of the islands 110a-n runs independently on the local computer 210. Each island calculates the operation of objects 215a-m within the island 110a, and generates a rendering for the other systems of the vehicle. The islands 110a-n operate in replication to one another based upon synchronization messages provided from the reflector 130, as will be discussed in significant detail below.

Figure 3:
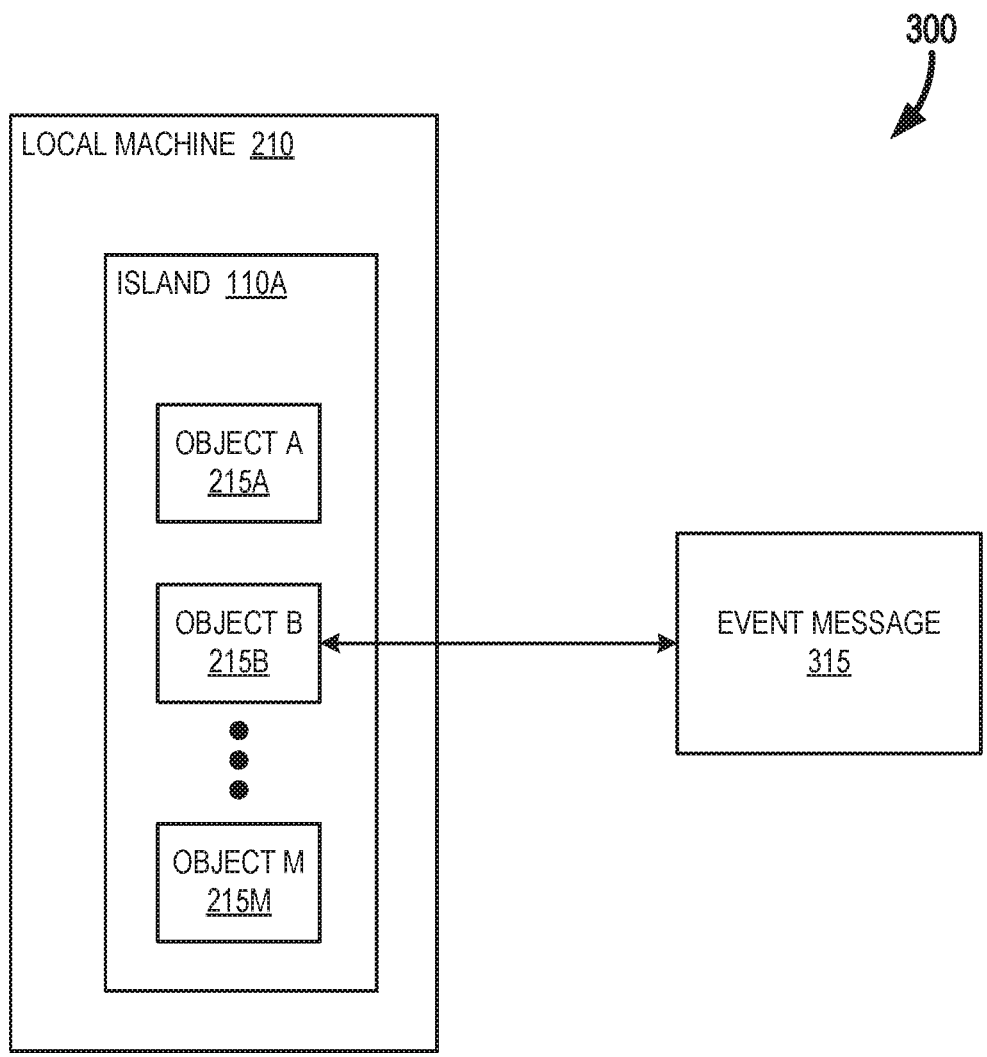
FIG. 3 is an example logical diagram of the local machine in communication with an event message, in accordance with some embodiments.

Moving to FIG. 3, it can be seen that objects 215a-m within a given island 110a can only be accessed by reference externally, whereas between objects in the island messages may be sent between the various objects directly. An external event message 315 is used whenever an object is externally accessed. By default, subscription handlers for events published in the same domain are invoked synchronously, just like a direct method call. This makes them very efficient since no buffering is required. In contrast, subscription handlers for events published in a different domain are invoked asynchronously. That means the events are buffered, and only after the code in the publisher's domain has finished running, the queued events are processed. (In a multi-threaded environment, processing of the queued events could start concurrently).

Figure 4:
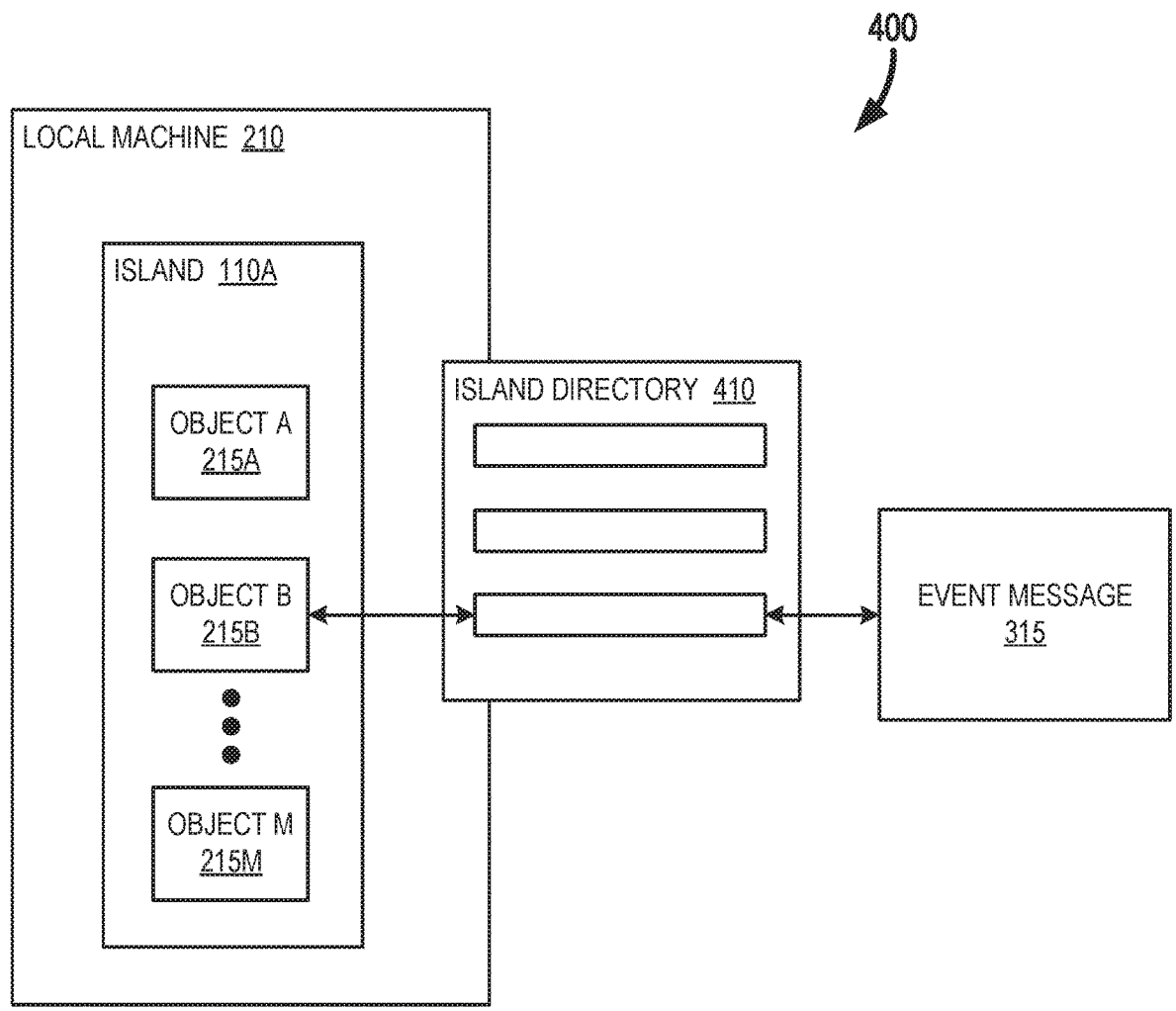
FIG. 4 is an example logical diagram of the local machine with an island directory, in accordance with some embodiments.
Figure 5:
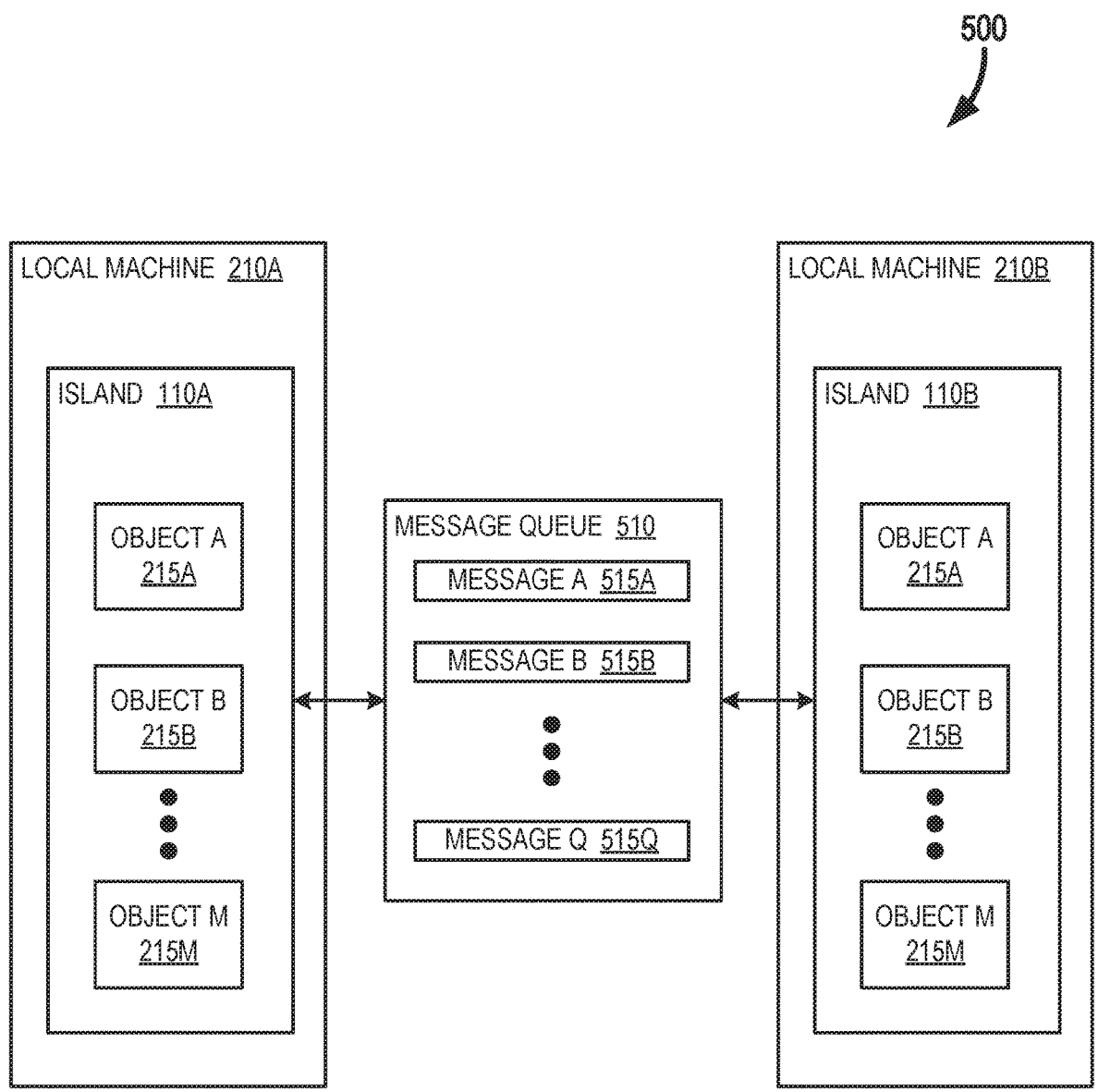
FIG. 5 is an example logical diagram of two local machines embodied in two vehicles in communication with a message queue, in accordance with some embodiments.

Turning to FIG. 4, an example of this queue of events is provided, at 400. The island 110a maintains a list of the named objects in a directory 410, which is accessible externally. The messages may thus be sent indirectly to the object 215a-m in the island 110a via the event message 315. However, rather than rely upon event message 315, in some embodiments it is significantly more efficient to directly replicate events between the various islands. For example, turning to FIG. 5, two local machines 210a and 210b respectively, are communicating via a message queue 510 that includes a series of messages 515a-q which are executed in each island 110a-n in order.

The replicated islands are deterministically equivalent, which is critical for a virtualized representation of the environment which the various vehicles are all relying upon, and are replicated via a checkpoint mechanism that will be discussed in greater detail below. All internal future messages are implicitly replicated, and all external future messages are explicitly replicated. The island structures remain identical, resulting in identical results between the islands.

Figure 6:
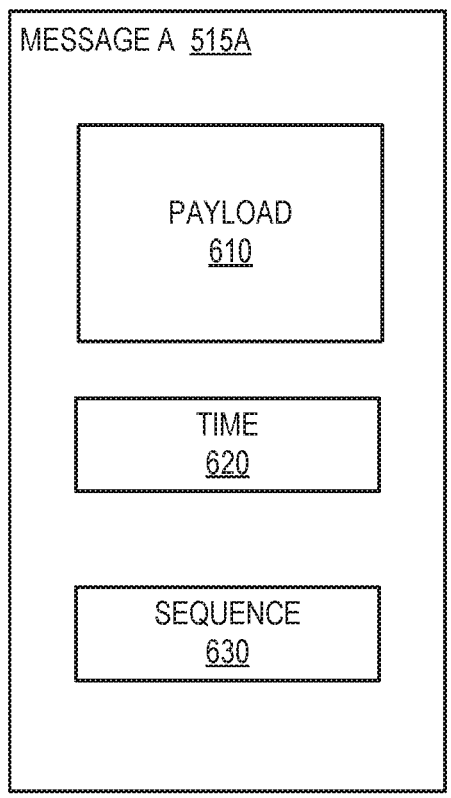
FIG. 6 is an example logical diagram of a message, in accordance with some embodiments.

The messages 515a-q are ordered in the message queue 510 in order of time. An example of a message format is provided in greater detail in relation to FIG. 6. Here it can be seen the message itself is relatively lightweight, resulting in minimal bandwidth overhead. The message 515a includes a payload 610, which may include the target, the message itself, and attendant arguments. The message likewise includes the time 620 and sequence 630. The target indicates which object the message relates to. The message itself is the action taken (e.g., to move the object for example). The argument is the condition of the message. For example, if the message is to move the object, the argument may indicate the speed, acceleration and direction in which the object should be moved. The sequence 630 element is used to order the messages within the queue 510, and therefore determine when the actions of the message are executed. The time 620 is appended by the reflector, and is used to progress execution of messages in the local machine. Messages can be generated either internally, as the result of the execution of a previous message inside of an island, or externally, as the result of an external event usually generated by one of the users of the system.

There is virtually no difference between internally and externally generated messages as far as the internal execution of the island is concerned. A major difference between the two is that the timestamps on externally generated messages are used by an island to indicate an upper bound to which the island can compute its current message queue without danger of computing beyond any possible pending messages.

The definition and manipulation of time plays the central role in how the system is able to create and maintain a replicated island state. The system must be able to guarantee that every internally generated message will be executed in exactly the proper order at exactly the proper time, which maintains the fidelity of the abstracted environment across all vehicles. Externally generated messages must be properly interleaved with the internally generated messages at exactly the right time and order. In order to achieve this, when a new message is generated, it is inserted in the sorted queue based upon its execution time.

Figure 7:
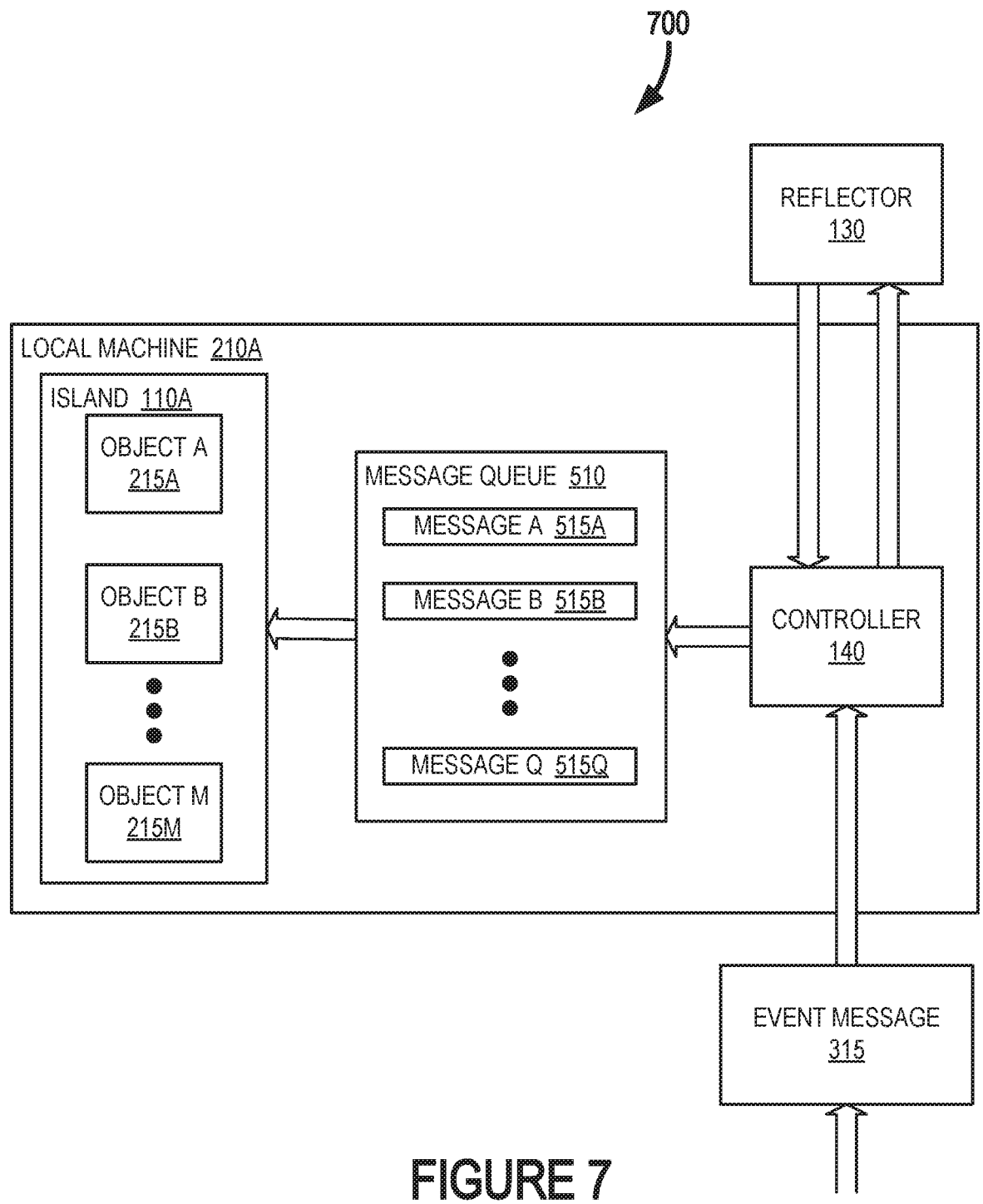
FIG. 7 is an example logical diagram of a local machine embodied in a vehicle operating in conjunction with a controller and reflector embodied in either a base station or another vehicle in response to an external event message, in accordance with some embodiments.

Turning now to FIG. 7, a logical diagram 700 for the replication of an event is provided. At this point, the island 110a-n replica's state is identical to the original island. The state can only change in response to external events (here the event message 315). The controller 140 manages the flow of external events into the island. The controller 140 connects to the reflector server 130. All replicas of an island 110a-n connect to the same reflector 130.

When an event is published outside of an island 110a-n, and an object inside the island is subscribed to it, the island's controller 140 sends the event to the reflector 130. The reflector 130 puts a timestamp on it, and relays the event to all controllers 140 for all replicas of that island, including the originating controller (hence the name, "reflector"). When the time-stamped event is received from the reflector 130, it is sorted into the island's future event queue 510. Then the simulation is advanced to the event's time stamp. If no event is sent to the reflector from any client within a certain time frame, the reflector manufactures a "heartbeat" event to advance time in the replicated islands.

Figure 8:
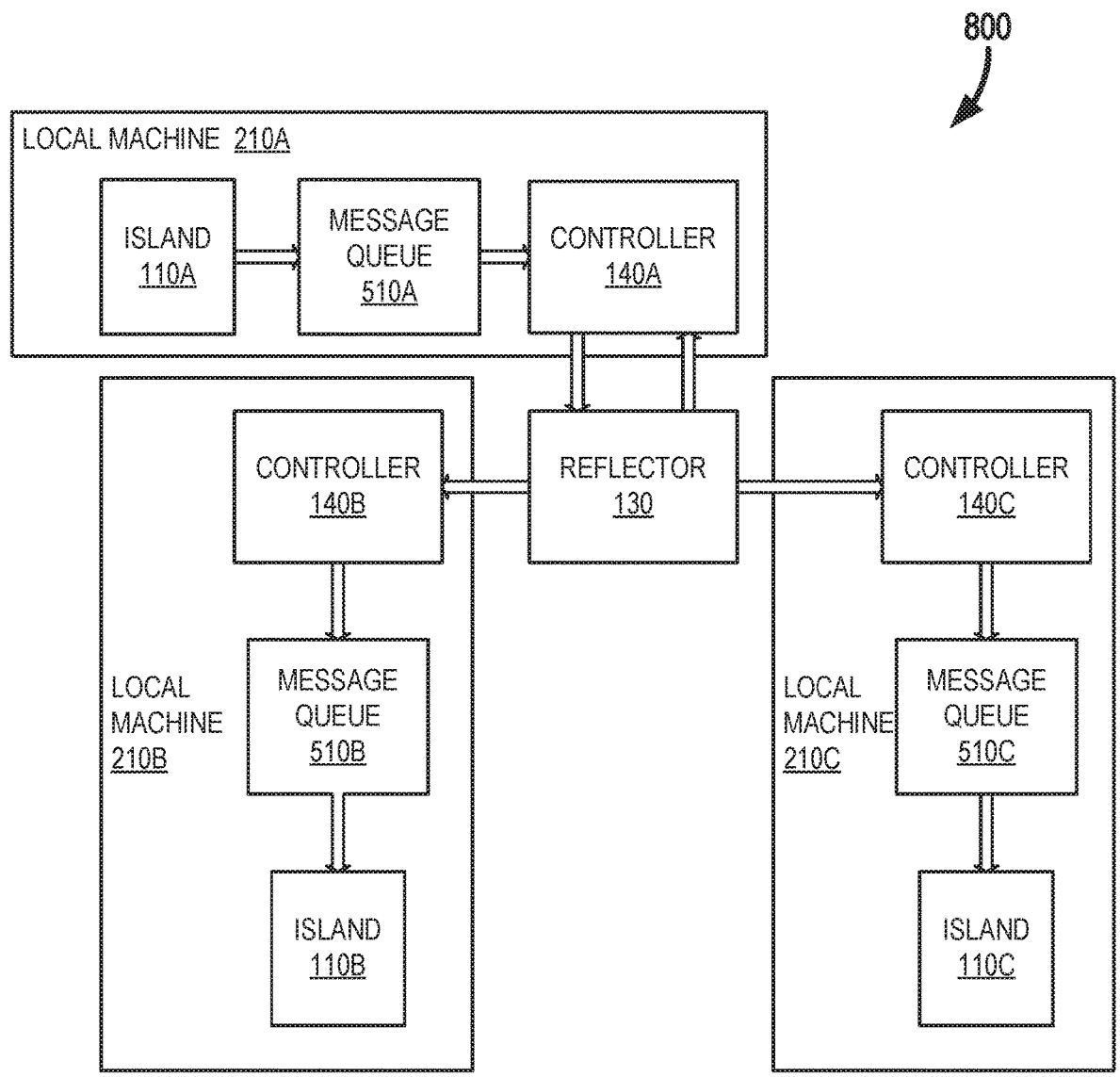
FIG. 8 is an example logical diagram of three local machines synchronizing through a reflector, in accordance with some embodiments.

While this process is illustrated in relation to a single island in reference to FIG. 7, the same process occurs when there are multiple islands with objects subscribed to the same event, as seen in FIG. 8, which is the use case when considering a vehicle flock. In this example, local machine 201a includes an island 110a that includes an event that is to be replicated across the other islands. This message is sent via the controller 140a to the reflector 130. The reflector 130 provides a unique timestamp to the message, and returns to the original controller 140a as well as all other controllers 140b and 140c that are mirroring the island. Each of the three controllers 140a-c provide the message to their corresponding message queue 510a-c, respectively. The message is ordered within the queues based upon the timestamp, and the messages are executed in time order in each local machine 210a-c in their respective island 110a-c.

As the state of each island 110a-c was initially identical, and the messages were distributed to each island and executed synchronously, the resulting environments in each island will continue to be identical.

An island's view of time is defined only by the order of the messages it has in the internal queue 510. Islands can only respond to external, atomic, time-stamped messages. These messages are literally the island's clock. Though islands have internal time based messages that can be queued up, these cannot be released for computation until an external time based message has been received which indicates the outer temporal bound to which the island can compute. Thus, even when there is a large number of internal messages ready to be executed, they remain pending until an external time stamped message is received indicating that these internal messages are free to be computed up to and including the newly received message. Each island's message queue is processed by a single thread, so issues with improperly interleaved messages do not arise.

When a message is executed, the time remains atomic in that it does not advance during the execution of this message. The "now" of the message stays the same. When a future message is generated during the current message, the new message always defines its execution time in terms of the current "now" plus an offset value. This offset should generally be greater than zero (though in fact zero is an acceptable value in certain circumstances, it should generally be avoided because if it is infinitely iterated, the system can't advance and will appear to freeze.) If multiple future messages are generated, they will have an identical "now", though they may have different offsets. If two messages are generated at the same "now" and with an identical temporal offset value, an additional message number is used to ensure deterministic ordering of the messages. All this ensures perfect fidelity between mirrored islands.

All of the messages in the island queue are "future" messages. That is, they are messages generated as the result of the execution of a previous internal message with a side effect of sending messages to another object at some predefined time in the future, or they are messages that are generated as the result of an external event—usually from a user—that is posted to the island to execute at some point in the future, usually as soon as possible. All of these messages have time stamps associated with them. The internal messages have time stamps that are determined by the original time of the execution of the message that initially posted the message plus the programmer defined offset. The external messages have a time that is determined by the reflector and is set to a value that is usually closely aligned with an actual time, though it doesn't need to be.

As noted previously, internal future messages are implicitly replicated; they involve messages generated and processed within each island replica, so they involve no network traffic. This means that an island's computations are, and must be, deterministically equivalent on all replicas. As an example, any given external message received and executed inside of a group of replicated islands must in turn generate exactly the same internal future messages that are in turn placed into the islands' message queues. The resulting states of the replicated islands after receipt of the external message must be identical, including the contents of the message queues.

Likewise, external future messages are explicitly replicated. Of course external messages are generated outside of the scope of an island, typically by one of the users of the system. The replication of external messages is handled by the reflector 130 as seen previously.

External non-replicated messages are extremely dangerous and are generally avoided. If a non-replicated message is executed and happens to modify the state of an island it breaks the determinism the island shares with the other replicated copies. This can be extremely detrimental to system fidelity, except in when rendering the contents of an island, but this is extremely well controlled to avoid any breakage of determinism.

Each island has an independent view of time that has no relationship to any other island. For example, a given island could have a speed of time (relative to real time) that is a fraction of another. This is useful for collaborative debugging, for example, where an island can actually have a replicated single step followed by observation by the peers.

Since time is atomic and the external messages act as the actual clock, latency has no impact on ensuring that messages are properly replicated and global island state is maintained. Higher latency users have a degraded feedback experience as a result, but the replication does not suffer in any manner.

II. Replication Methods

Now that the general systems for a replicated collaborative shared environment for use in vehicle flocking have been provided in considerable detail, attention will be turned to processes employed to enable this replicated architecture.

Figure 9:
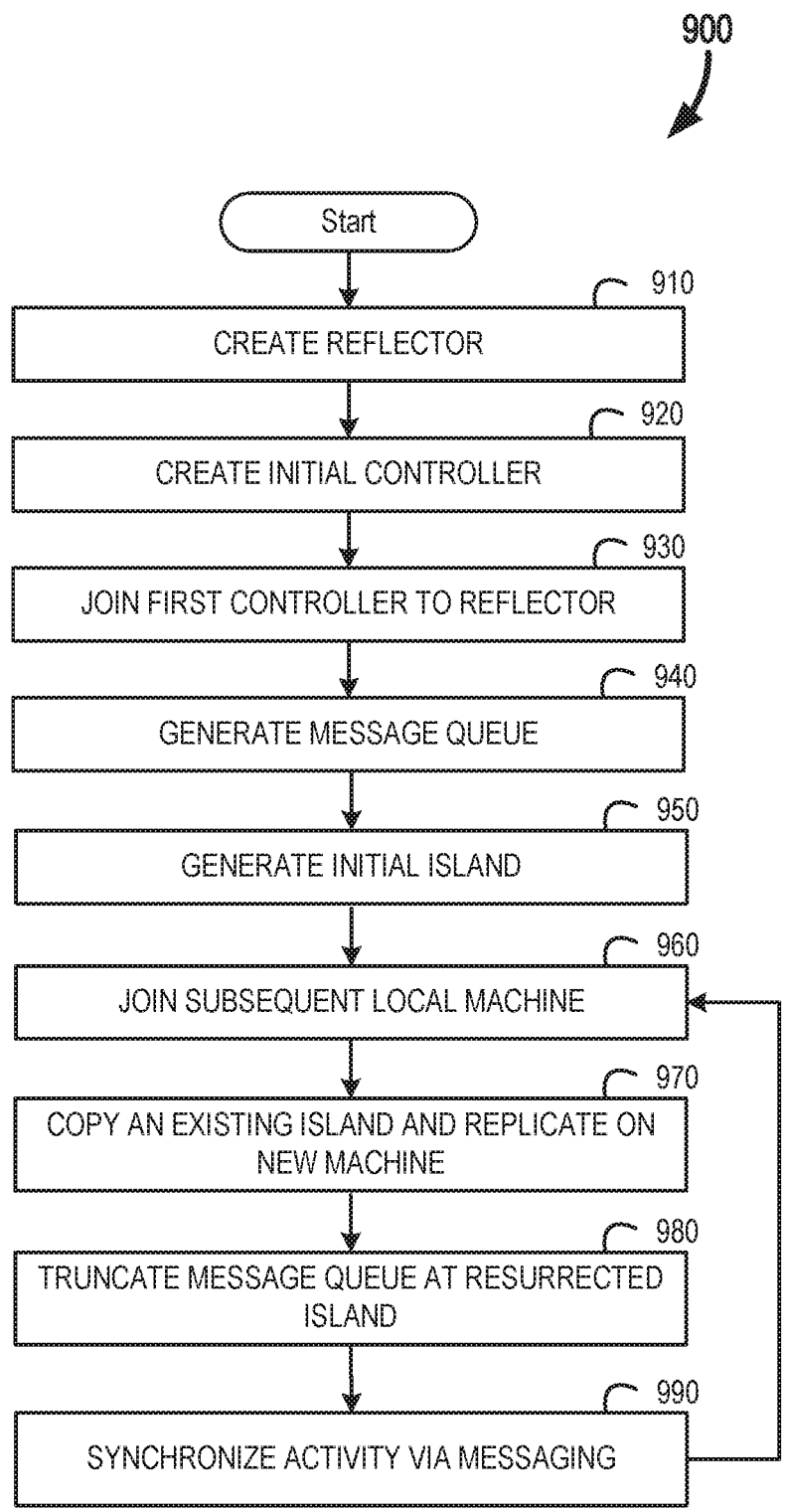
FIG. 9 is a flow diagram for an example process of generation of a shared virtual space via reflection, in accordance with some embodiments.

Turning to FIG. 9, a flow diagram 900 for an example process of generation of a shared virtual space via reflection is provided. In this example process, initially a reflector is created (at 910). The local machine initializing the process will may host the initial reflector, but often the reflector is a dedicated computational device co-located at a cellular base station, or otherwise distributed around the coverage area. Alternatively, the reflector can be on any accessible machine on the network—either remotely on a WAN, locally on the LAN, or on the same machine that will act as host to the original island. Reflectors are extremely lightweight objects, so they really don't take up many resources, either in space or computation. The reflector has a network address and port number that is how it may be found later.

Subsequently an initial controller is generated as well (at 920). The new controller is generally on the local machine of the vehicle. It is provided the reflector's address and port number. The initial controller joins the first reflector (at 930), and creates the initial message queue (at 940) by publishing its message stream to the controller. The only messages coming from the reflector at this point are the heartbeat messages—assuming the reflector has been configured to generate these. Messages are directly tied to the sensory inputs from the vehicles already within the reflector coverage area, from third party data sources, and the vehicle conditions (e.g., speed location acceleration, and even higher level information such as stopping distances, traction etc.). In any case, the controller is designed to simply begin adding these messages to its message queue. This is actually important when joining an already existent replicated island, because in that case many of the messages that get sent and stored on the queue will be necessary to bring the island replica up to date after it is replicated locally. Joining is view only access. At this point, even if there were an island, the user is not allowed to send messages that might modify it in any way.

Figure 10:
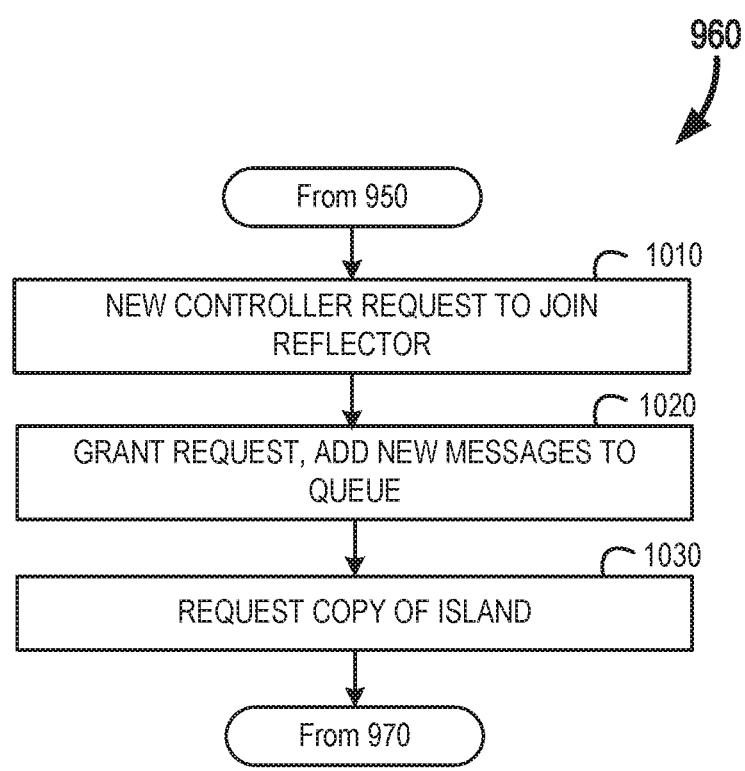
FIG. 10 is a flow diagram for an example process of the joining of a new local machine, in accordance with some embodiments.

Only after the initial queue has been generated is the initial island generated (at 950) by the controller. The vehicle is able to populate the island and have objects within it begin sending their own internal messages to the message queue. This initial island may operate alone for as long as desired. However, when an additional vehicle wishes to join the shared environment, a subsequent local machine needs to join the island network (at 960). FIG. 10 provides a more detailed diagram of this sub-process of subsequent machine joining.

Initially the new controller for the subsequent local machine makes a request to join the reflector (at 1010). The reflector grants the request, and adds messages to the queue of the new controller (at 1020). The controller requests a copy of the island from the reflector (at 1030), which completes the joining process. Returning to FIG. 9, a copy of the initial island needs to be generated, which is then replicated onto the new machine (at 970). Importantly, the message queue for the new machine is then truncated down to the event of the replicated island copy (at 980). This truncation ensures that extraneous actions are not taken/repeated in the newly replicated island.

Figure 11:
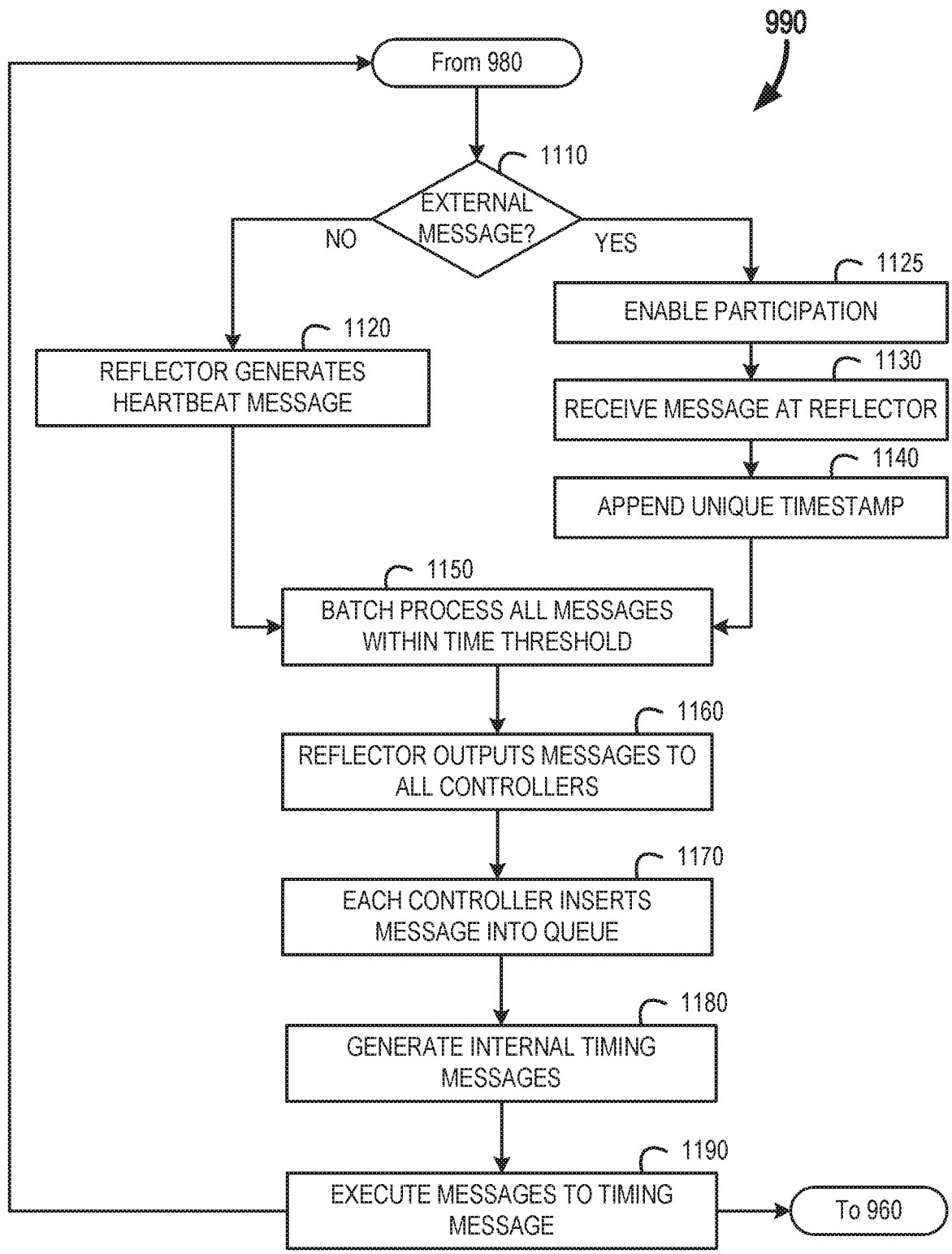
FIG. 11 is a flow diagram for an example process of the synchronizing of the islands, in accordance with some embodiments.
Figure 12:
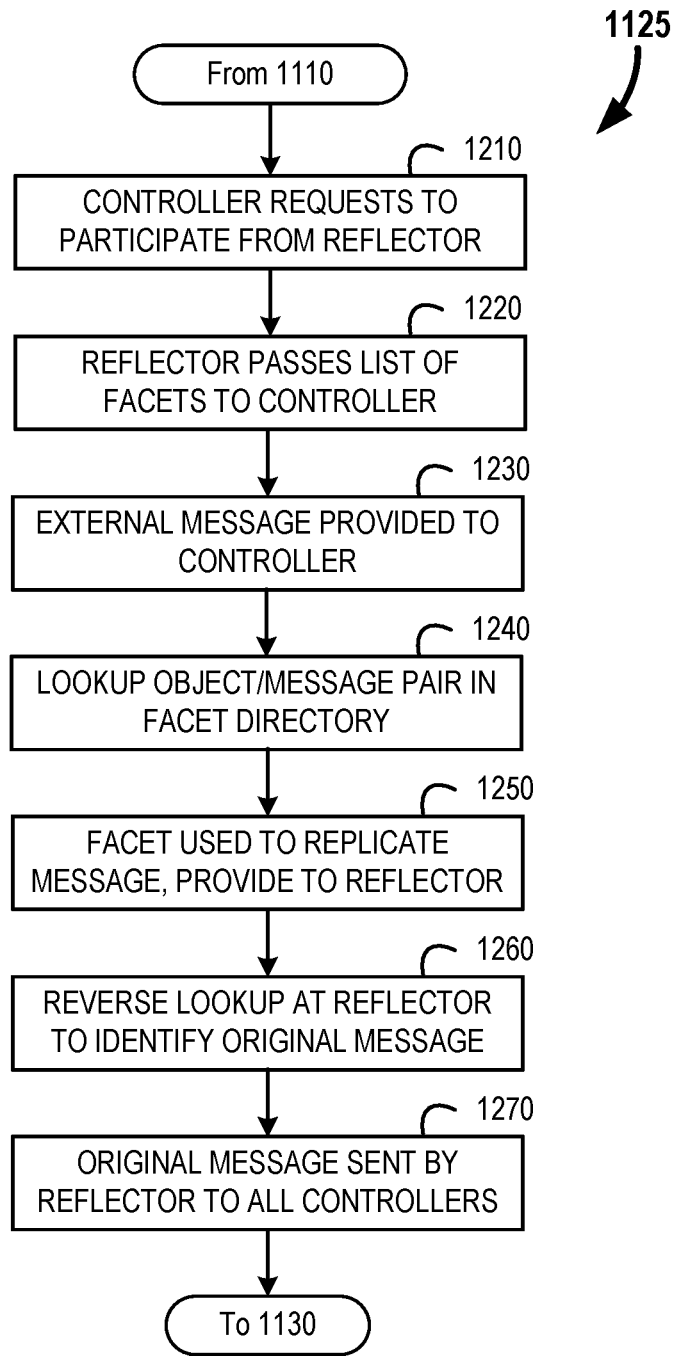
FIG. 12 is a flow diagram for an example process of the participation enablement, in accordance with some embodiments.

Lastly, the activities between the islands progress in synchrony (at 990) which is described in greater detail in relation with the process of FIG. 11. In this example process, initially a determination is made if the message is external or not (at 1110). If it is an internal message, the reflector can generate a heartbeat message (at 1120) since internal messages are unable to progress time (as previously discussed). If it is an external message however, the process must ensure that the local machines are all enabled to participate (at 1125). FIG. 12 describes this participation enablement operation in greater detail. It begins with the controller requesting to participate to the reflector (at 1210). The reflector passes a listing of facets to the controller (at 1220), and the external message is then provided to the controller (at 1230). Each facet dictionary is unique to a controller/island pair. The controller cannot send a message if it is not in the facet dictionary, thereby ensuring that only trusted vehicles have the ability to modify a given state in the replicated islands.

The controller performs a lookup of the object/message pair in the facet directory (at 1240) and the facet is used to replicate the message. This replication is then provided back to the reflector (at 1250). At the reflector, a reverse lookup is performed to identify the original message (at 1260), and this original message is sent by the reflector to all controllers (at 1270).

Returning to FIG. 11, after enabling participation of the controllers, the external message is received at the reflector (at 1130), and a unique timestamp is appended to the message by the reflector (at 1140).

Regardless of whether the message is an external message with a timestamp appended, or a simple heartbeat message, the reflector outputs the message to all controllers (at 1160). Optionally, the reflector may collect all messages received in a given time window/threshold and batch process these messages before outputting them to the controllers (at 1150). Batch processing in this manner may cause some approximations in event timing, but for a small enough window these artifacts are not significant to vehicle operation or safety. The benefit of such batch processing however, is a further reduction in required bandwidth, which may be important depending upon the type of wireless connection between the vehicles and the reflector, and the number of vehicles in the flock.

After the messages have been received by the controllers, they are inserted into the queue at each local island (at 1170) based upon their timing. The messages in the queue may then be executed at each island in sequential order based upon the timing (at 1190). Prior to the step, however, it is also possible to generate internal timing messages based upon the received external message timing (at 1180). These internal "pseudo-heartbeat" signals may be utilized to reduce the dependence upon external heartbeat signals, thereby even further reducing bandwidth requirements.

Synchronization/processing of messages in time order is an ongoing process, and repeats as long as an island is active. Additionally, the system is able to add additional vehicles at any time a new local machine is able and authorized to join the mirrored group.

It should be noted that in each island are 'portals' which are the main access to the various islands. Portals can (but are not required to) be overlaid on top of each other. For example, an island portal may overlay a vehicle interface portal and system control portal, in some embodiments. Portals can include interface objects used to manipulate content of an island as well.

Islands may also include specialized objects known as 'ghost objects' which are objects that do not actually exist inside the island but behave as if they do. These objects actually exist in a separate island that is accessed by an overlay portal. Examples of these ghost objects could include portals connecting one island to another island. Thus, while islands cannot directly connect to one another they can still appear to be directly connected and act as if they are. This allows for even greater potential to optimize traffic congestion, or anticipate safety concerns outside the reflector coverage area.

III. Vehicle Flocking Optimization

While the basic architecture of mirrored islands provided in the above sections enables a shared environment between vehicles, attention will now be focused upon how the individual vehicles within the flock may leverage this virtual environment to increase safety and improve traffic conditions. As previously mentioned, current autonomous vehicles act entirely independently. They rely upon their own sensory data, and this limits their perception to a relatively short range (on average only up to 200 feet or so). This limits the safe speed and ability for the autonomous vehicle to anticipate hazards that may be outside the sensor range. Likewise, decision making is done on the individual vehicle level, which may actually increase traffic congestion due to the overly cautious behavior of these vehicles.

In the following figures, a car is illustrated for the vehicles in the flock. This is done for simplicity sake, and it is understood that any vehicle type may be included in the flock, including trucks, passenger vehicles, mass transit vehicles, boats and even transportation drones or other flying vehicles. Further, while attention is focused upon autonomous vehicles, it is understood that a manually driven vehicle may be included in the flock as long as it includes the necessary sensory inputs. This may increase safety of the manually driven vehicle if it includes advanced features such as collision avoidance, adaptive traction, or the like. It may also enable the display of messages to the user for increasing user awareness of future hazards, or suggested alternate paths to improve traffic congestion. Further the sensory data provided by these manual vehicles may provide a richer reflection of the actual environment within the virtualized environment, thereby benefiting the autonomous vehicles within the given flock.

Figure 13:
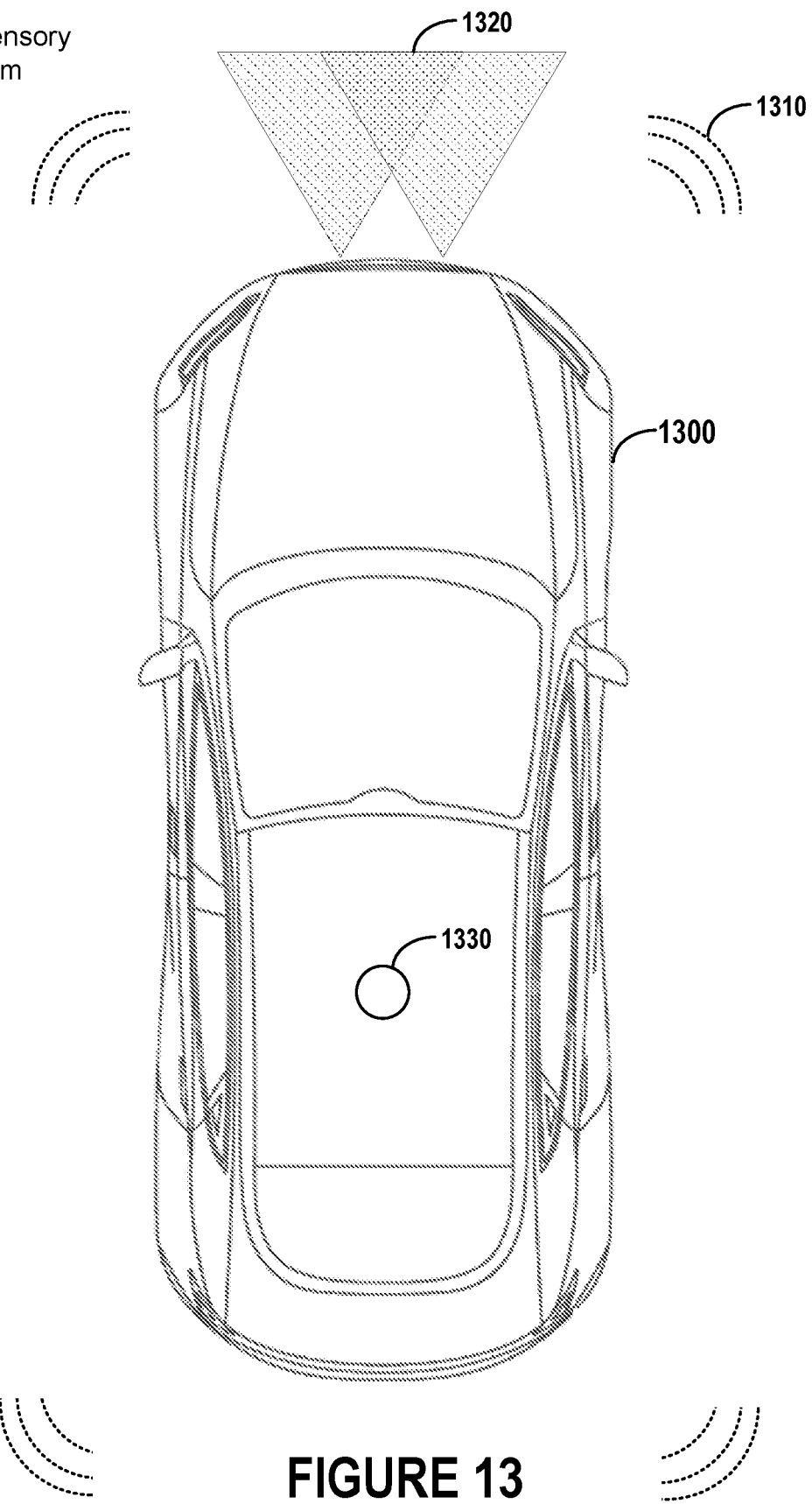
FIG. 13 is an example illustration of a vehicle with various sensors operating in tandem, in accordance with some embodiments.

Turning now to FIG. 13, an example vehicle 1300 is illustrated. The vehicle includes a series of sensory inputs. These may include various radar 1310 sources, optical sensors 1320 (preferably with greater than one cameras in order to generate depth information), and one or more LiDAR sensors 1330. These inputs may be collated to generate a fairly comprehensive view of the objects immediately surrounding the given vehicle. Other sensors that are contemplated, but not provided in the subject figure, could include thermal sensors (which are particularly helpful during rain and snow storms that render LiDAR and radar less effective), and sonar. The manner of how these individual signals can be combined will not be included in the disclosure for the sake of simplicity and clarity, but a number of known and proprietary code may be employed as developed by the major companies engaged in self-driving vehicles (e.g., Google, Uber, Apple and the like). These objects are located, and the accelerations, speeds and positions are noted in the message output by the vehicle.

In addition to these sensory inputs, vehicle data may be collected and shared with the flock's reflector. This vehicle data includes velocity, acceleration and position data for the vehicle, at a minimum. The vehicle data may additionally include handling characteristics for the vehicle based upon measured data. For example, assume the vehicle normally is capable of braking from 60 mph over a distance of 300 feet. However, assume that in the instant moment that the ground is icy or wet, or that the vehicle is towing a camper. The vehicle may measure that braking distances are actually 500 feet, in this example, and may include this information in the vehicle data input such that the abilities of the given vehicle may be more accurately modeled.

Additional information that may be provided to the vehicles in the flock may include data from third party sources. For example, in a smart city there may be a number of traffic cameras that may also provide object data (speed, acceleration shape and position) to the reflector for messaging to the vehicles in the flock. Further, non-vehicle information may be included, such as road conditions, other objects such as pedestrians, bikes, and other objects (e.g. a mattress on the roadway). Additionally, weather conditions which may impact vehicle handling, and time of day (to anticipate commute changes, sun blindness, or the like) may be provided to the flock vehicles.

Other information such as accident information, large events (such as a football game or concert), and emergency vehicle dispatches may also be provided to the vehicles in the flock. This data is particularly important in traffic optimizations that will be discussed below.

The collected data for a given geographic area covered by a reflector may be combined from all the various sources to generate a virtual environment that reflects the actual environment. This allows any given vehicle in the flock to "see" well beyond their own limited sensor range, and further allows objects to be more accurately defined. For example, if an object is viewed by two vehicles via LiDAR from two different angles, its speed, acceleration, position and shape can be cross referenced and better defined. This allows for significant redundancy in the system, as each vehicle supplying data essentially validates and refines the data from all other vehicles in similar sensory range. This also provides the ability for a vehicle to identify when a given sensory system may be malfunctioning. For example, if a number of vehicles identify an object in one location, but the given vehicle's LiDAR senses it in another location, it could signify that the calibration of the LiDAR mirror has been compromised (which could occur due to the sensor being moved or otherwise disrupted), for example.

The coverage area for a given reflector may be divided up by wireless coverage distance for the given reflector, or by cellular coverage areas that depend upon the number of devices being serviced by the given reflector. As noted, a reflector is a generally light weight computational device; however, in some cases where traffic optimization calculations are being performed by the reflector, the computational capabilities may be considerably higher. The reflector should also have a means for communicating with the vehicles in the flock. This can be over and radio wave based protocol, but in many cases the usage of cellular bands may be ideal. This may include the reflector having a built in transponder, or the reflector being co-located with a radio tower of some sort.

Figure 14A:
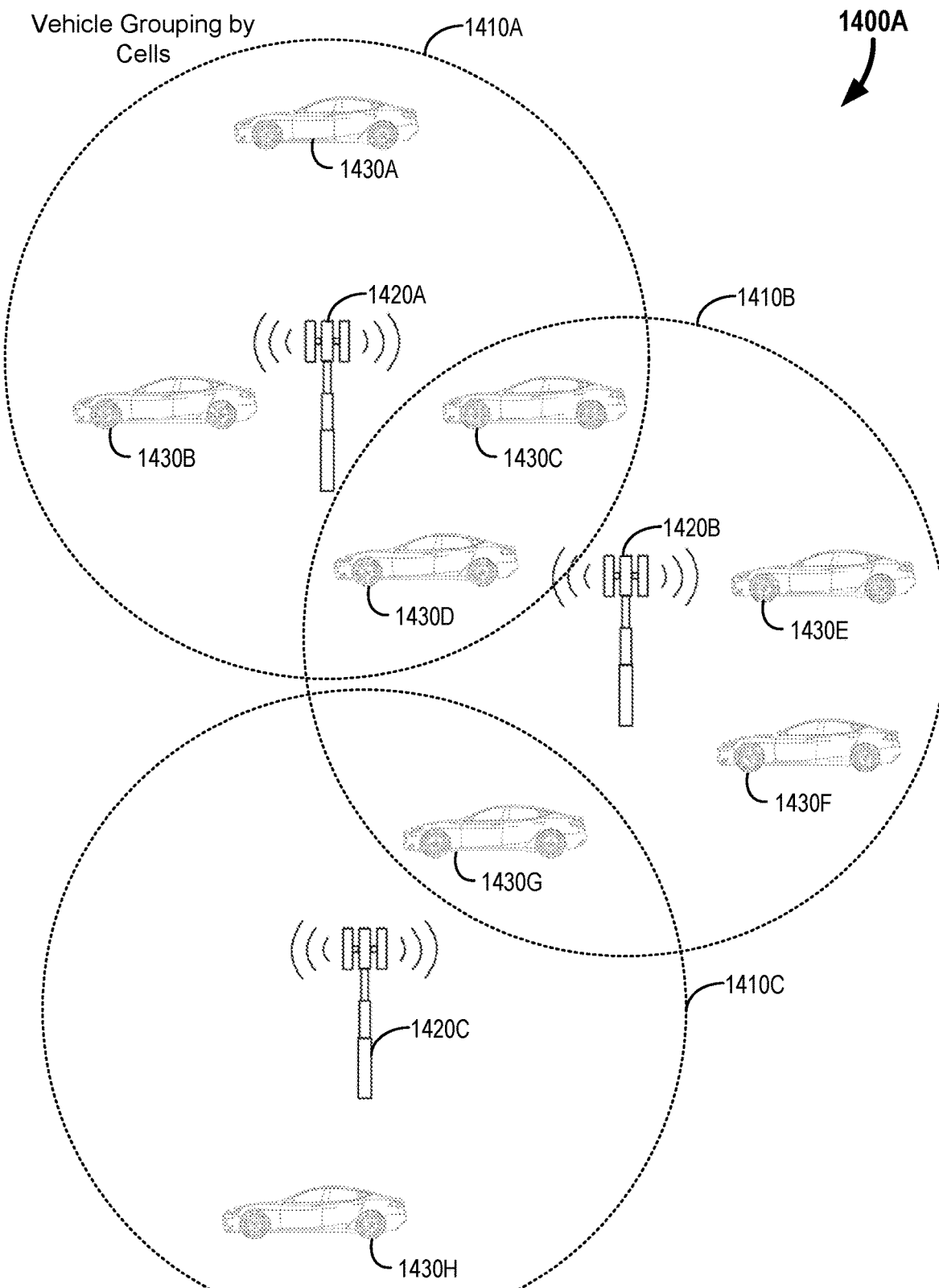
FIG. 14A is an example illustration of various "cells" of vehicles based upon static base station reflectors, in accordance with some embodiments.

FIG. 14A provides such a scenario where the reflectors are co-located with cellular towers, at 1400A. In this example drawing, the reflector and cellular base station 1420A-C each includes a coverage area 1410A-C that defines which vehicles 1430A-H belong in which flock. The coverage area for each base station reflector 1420A-C may overlap, especially in more crowded urban areas, thereby allowing for providing a more "global" virtualized environment. Vehicles exclusively within a single reflector coverage area (also referred to as a "cell") will obviously belong to the flock they are currently in. However, vehicles in an overlapping coverage area may be assigned to a flock based upon load balancing considerations, or based upon their current movements. For example, if vehicle 1430D is moving away from base station reflector 1420A and towards 1420B, then it may be advantageous for the vehicle 1430D to belong to the flock serviced by 1420B to minimize reflector reassignment to the vehicle.

Figure 14B:
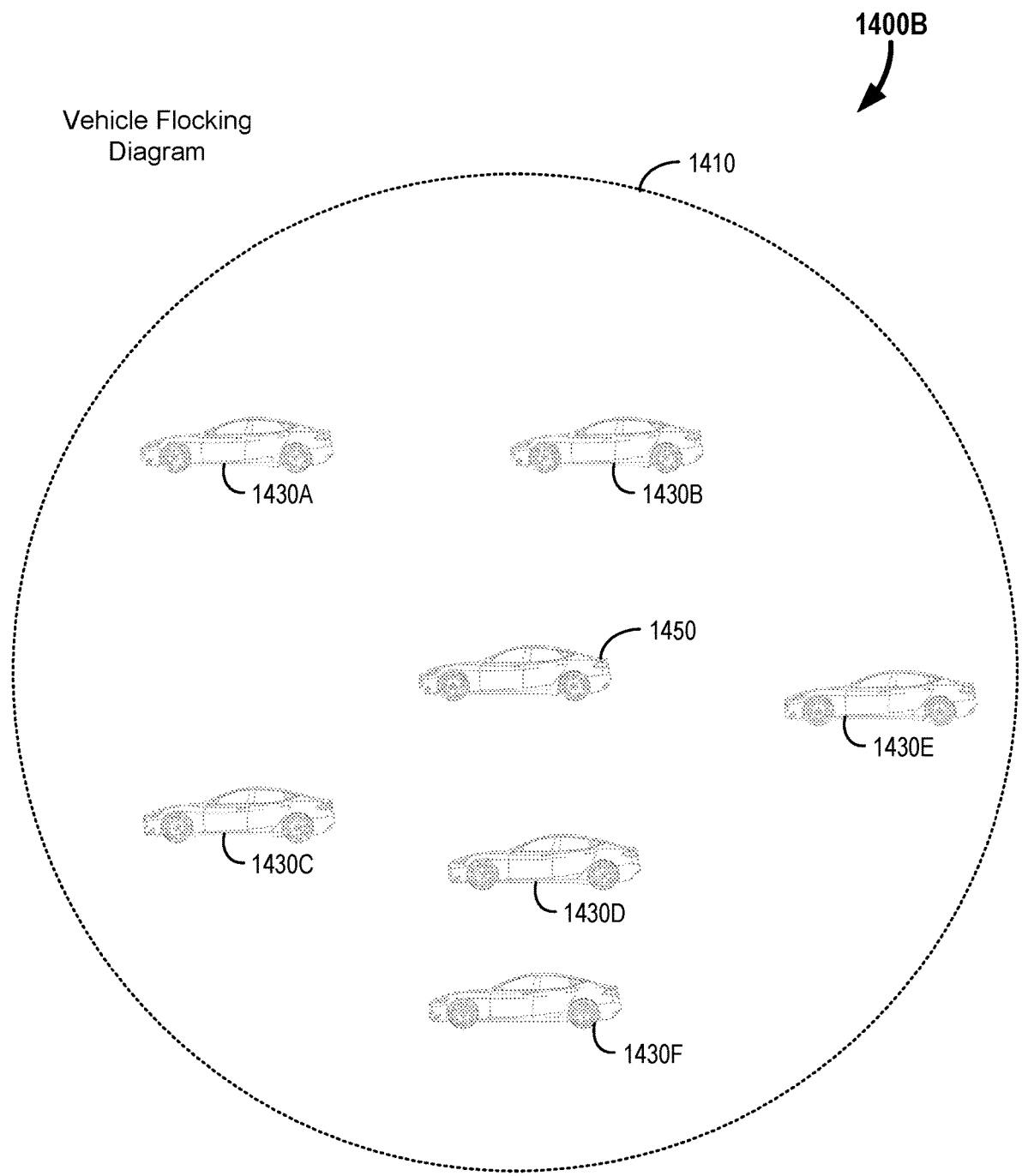
FIG. 14B is an example illustration of a "cell" of vehicles based upon dynamic vehicle reflectors, in accordance with some embodiments.

In addition or as an alternative to having static reflectors located at cellular base stations, the reflectors may instead be strategically placed throughout the landscape and be equipped with a wireless transmitter and receiver for communicating with the vehicles. Furthermore, it may be possible that the reflector is not static at all. In these embodiments, one of the vehicles itself acts as the reflector and generates an ad hoc cell. FIG. 14B provides an example of such a mobile flock, at 1400B. Having such a dynamic reflector may be particularly attractive in locations with minimal cellular service/limited cellular base stations. For example, along rural highway space the cellular coverage may be minimal, and deploying sufficient reflectors may be cost prohibitive or logistically unfeasible. In such situations, having a central vehicle 1450 host the reflector is advantageous. The central vehicle reflector 1450 defines the flock cell 1410, and vehicles 1430A-F within this cell can all communicate with the reflector vehicle 1450 to generate the flock. The reflector in this example, may be dynamically updated as necessary to keep the maximum vehicles within any given flock coverage area.

Figure 15:
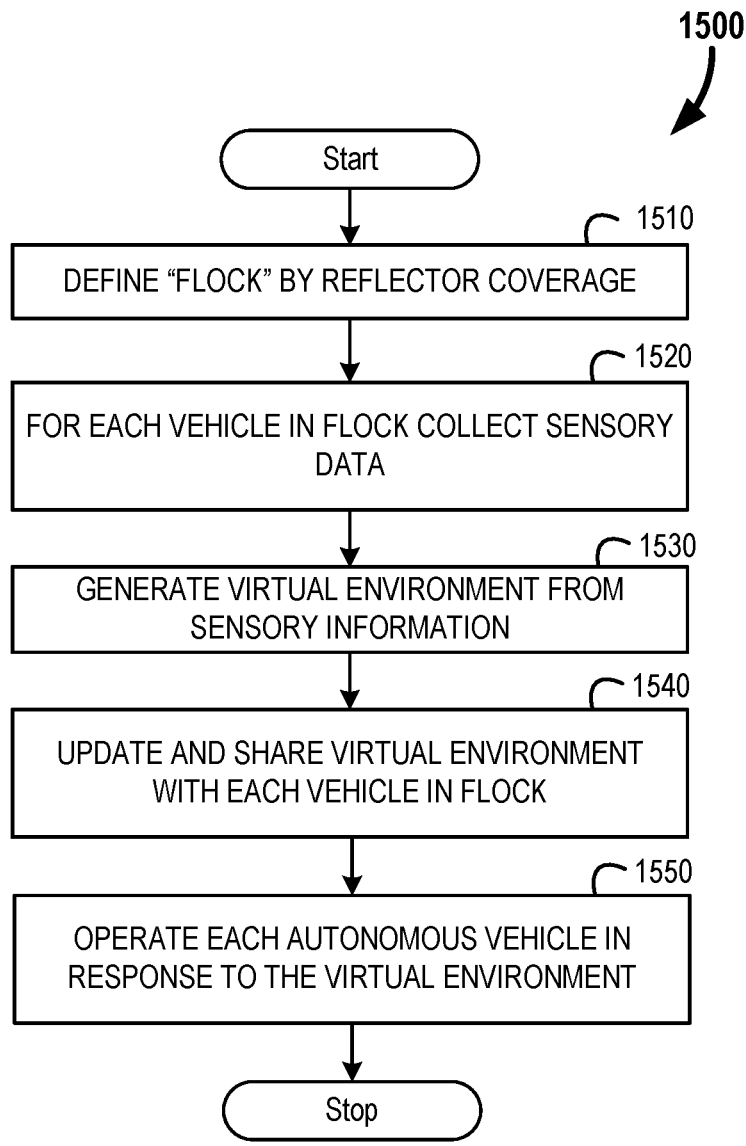
FIG. 15 is a flow diagram for an example process of vehicle flocking, in accordance with some embodiments.
Figure 16:
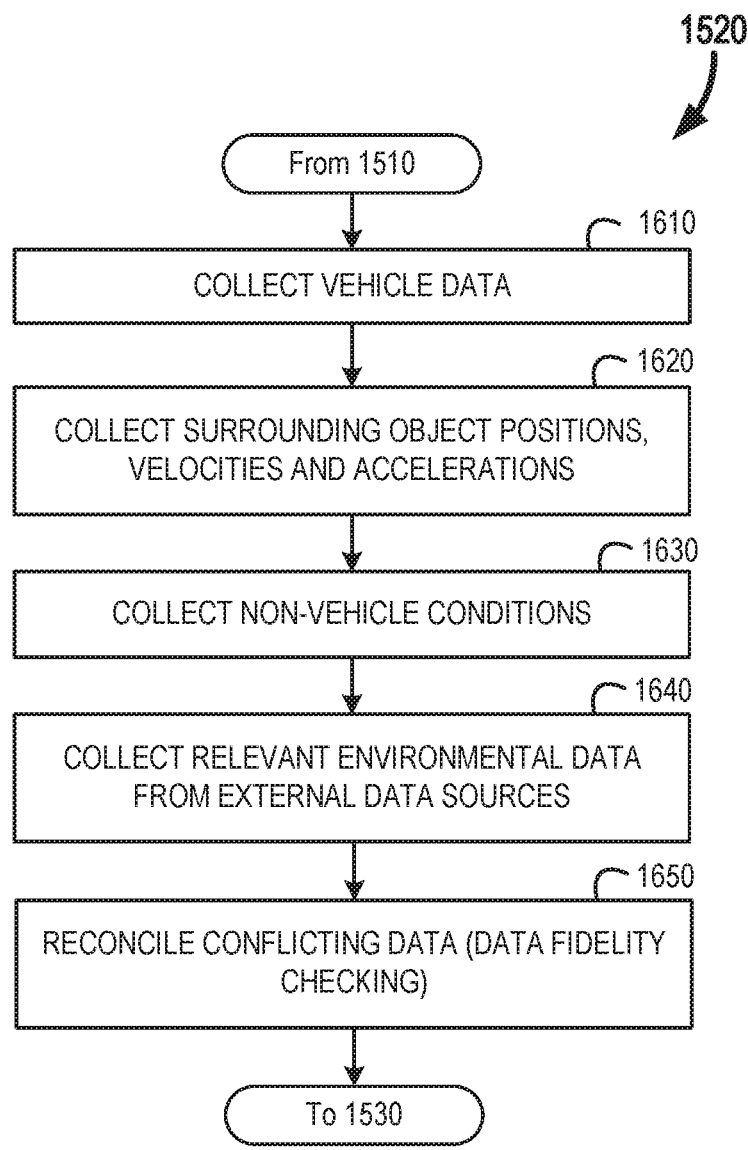
FIG. 16 is a flow diagram for an example process of sensory acquisition for the vehicle flock, in accordance with some embodiments.

Moving forward, FIG. 15 provides a flow diagram for an example process 1500 of vehicle flocking. Initially the flock is defined by the reflector coverage area (at 1510). For each vehicle within the flock, with the necessary sensory and transmission capabilities, the sensory data and vehicle data is collected (at 1520). FIG. 16 provides greater detail into this sensory collection process. As noted previously, vehicle data is initially collected (at 1610). Vehicle data, at a minimum, includes speed, acceleration and position data for the given vehicle. It may also include measured handling data, safety features, type and weight of the vehicle as well. Such information may be particularly important if there will be an inevitable collision between the autonomous vehicle and another vehicle. For example, it a sudden object falls off a truck and two autonomous vehicles are behind the truck, and given space constraints only one vehicle can actively avoid the object, the system may determine the vehicle with a superior frontal impact safety rating and a higher weight should be the vehicle to strike the object. Lastly, in relation to autonomous vehicles, it is known where the vehicle is heading, therefore it is possible to model future traffic conditions even tens of minutes in advance.

In addition to the collection of vehicle data, the data regarding surrounding objects is collected from the suite of sensors located upon each vehicle within the flock (at 1620). Generally this includes radar signals, LiDAR data, and optical data. This sensory data may further include echolocation signals, thermal images, transponder data, or the like. From this data the location, speed, shape/size and acceleration of the various objects within the sensory distance of the given vehicle may be computed, as is known in the art.

Non-vehicle conditions may likewise be collected (at 1630). This includes data from third party sources, such as the existence of an emergency dispatch, current road conditions, traffic light patterns, and the like. Similarly, environmental data can be collected from external data sources (at 1640). This includes such things as weather data (and expected weather data), the time of day, data from traffic or smart city cameras, existence of large scale events that may impact traffic conditions, and historical traffic patterns. All of the collected data may be reconciled (at 1650) to ensure data fidelity. For example, object data from two different vehicles in the same general location may be compared to determine if there are any discrepancies, and further to better characterize the objects. "Hard" data, such as vehicle location, speed and accelerations (as measured by GPS, accelerometers, and tire rotation sensors) for a first vehicle may be compared against the object data from another vehicle that corresponds to the first vehicle. The hard data may be assumed to be more accurate than senses data, and discrepancies may be resolved accordingly. Similarly, when many vehicles are sensing the same objects, the quorum of vehicles sensory data may out-weigh outlier sensory data.

Returning to FIG. 15, the collected data is utilized to generate an expansive virtual landscape that accurately reflects the real world landscape (at 1530). This virtualized environment includes all the obstacles and objects that exist in the actual world, and also appends relevant information to each object. This virtual world is continually updated and replicated at each vehicle within the flock in the manner discussed in the previous section (at 1540). This results in each vehicle "knowing" not only the landscape for which it has direct sensory information for, but also information that is near omniscient within the flock coverage area. This allows each autonomous vehicle to operate in response to not only immediate road conditions, but further to anticipate future conditions (at 1550). For example, if it is known that an object is in the roadway a quarter mile ahead, the vehicle can switch lanes early, thereby preventing an emergency swerve or lane change at the last moment. Likewise, if the vehicle knows that three nearby vehicles are planning on entering at the next onramp, the vehicle can act to accommodate their merger in a manner that avoid unnecessary braking or jerky accelerations.

The safety ramifications of knowing the larger environment are self-evident. Vehicles operating in the flock can better avoid objects, and plan for maneuvers in advance that would otherwise be impossible for the vehicle to know about. However, in addition to the clear safety benefits, the ability to know the larger flock coverage allows for some unique traffic optimizations.

Figure 17:
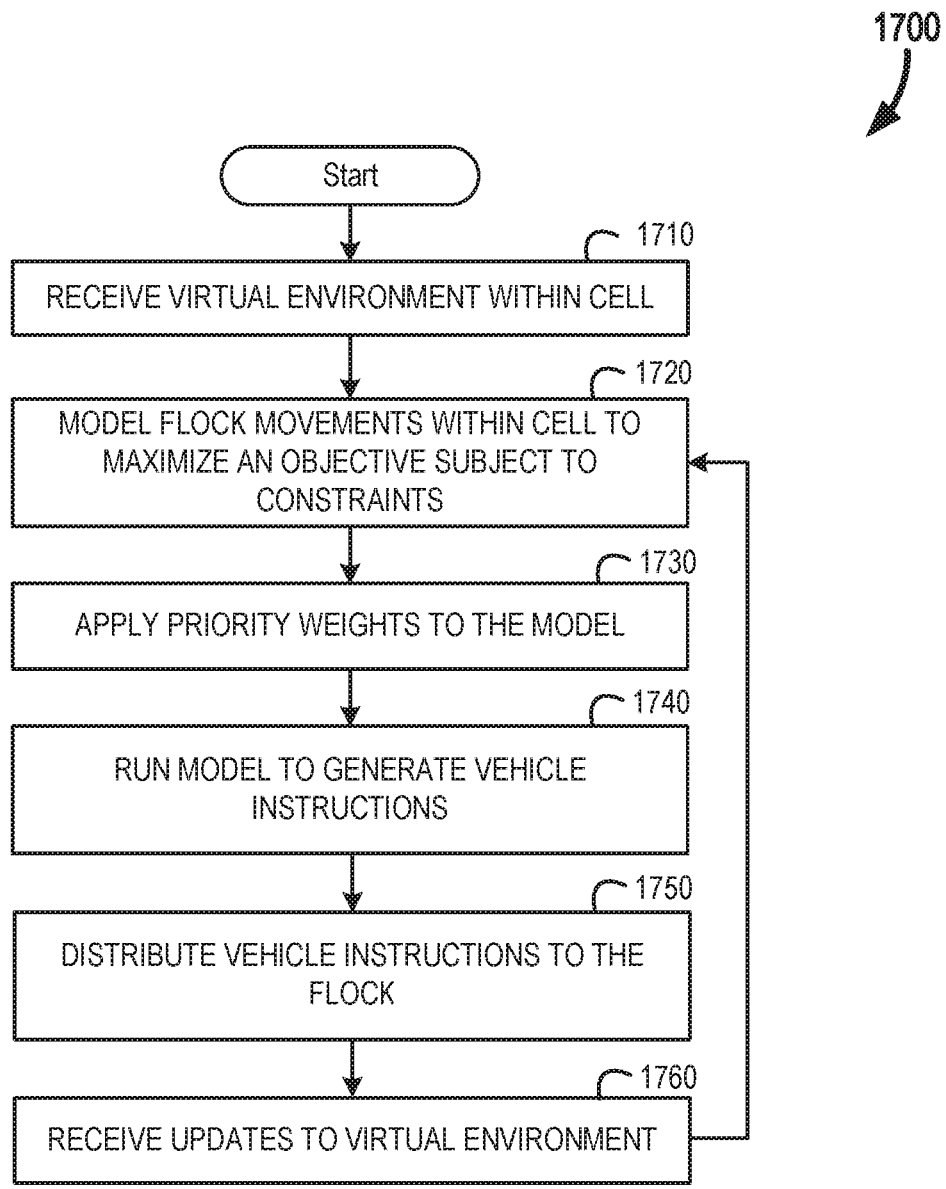
FIG. 17 is a flow diagram for an example process of inter-cell traffic optimization for a vehicle flock, in accordance with some embodiments.

FIG. 17 provides a first diagram of an example process that optimizes traffic flow within a cell, at 1700. This process begins when the virtual environment has been built (at 1710) and takes place in a central computing location. Generally, a computational device either coupled to the reflector, or integrated into the reflector may be used for this traffic optimization activity. Of course it is considered that the optimization may occur as a distributed computation across multiple local machines operating within the flock as well.

Flock movements within the flock coverage area are then modeled (at 1720). Information regarding where each vehicle is heading, their current locations, and existing road hazards and objects are all utilized in this model. Likewise, much of the data collected before, such as road conditions, time of the day, large events, and even traffic light timing may all be leveraged to model the flow of vehicles. The base model may utilize fluid flow models, which are remarkably accurate as an analogy for traffic patterns, in some embodiments. Of course additional traffic flow models may likewise be applied as desired.

The models may further be adapted based upon the number (or percentage) of vehicles within the flock coverage area which are part of the flock, as opposed to operating independently. When all, or a significant portion, of the vehicles are flock vehicles, the model for traffic flow can be computed with a high degree of specificity and confidence. Alternatively, if there are a large number of manually driven vehicles (or non-flock autonomous vehicles) on the road, then the fluid dynamics portion of the model may be emphasized, and a degree of error tolerance may be introduced into the model.

The models developed are designed for a specific objective. Generally this objective is to increase overall throughput of vehicles, while not delaying a given vehicle beyond an accepted threshold. In some embodiments, each vehicle may be treated the same within the model. That is each vehicle may be assigned an equal weighting (at 1730) prioritizing their speed to their destination. However, there may be situations where it is desired to have differing weights assigned to vehicles. The most obvious example is for emergency vehicles. These vehicles may be assigned a maximum weight, thereby allowing these vehicles to avoid basically all traffic. As the environment is modeled across a very larger area, vehicles may move out of the way for an emergency vehicle well before a human operator would be aware that the emergency vehicle is approaching. This results in much faster emergency vehicle response times, invariably saving many lives.

It is also possible that there are situations where weights of the general population of vehicles may be dynamically altered. For example, today we have special lanes for high occupancy vehicles (HOV) that are intended to reward carpooling with a reduced commute time. Likewise, we have market based approaches, whereby people who pay a toll may utilize express lanes. Each of these models could be replicated by altering the vehicle weights in the model such that these vehicles are provided a marginal benefit over other vehicles. In a more egalitarian manner, it is also possible that each vehicle may be afforded a monthly allotment of credits that may be utilized, at the discretion of the vehicle passenger, to increase the weighting of the vehicle. Everyone knows the panicked feeling of running late for an important meeting, or to pick up children, for example. This credit based approach would allow the passenger of the autonomous vehicle to choose when and if to use their credits to increase their priority in the model.

After the weights for each vehicle are assigned, the model may be run to generate instructions for each vehicle in the flock (at 1740). These instructions are then distributed to the flock vehicles (at 1750) using messages as described above, or through a discrete encrypted instruction platform. The flock vehicles then act upon the instructions. As the environment is ever changing, updated information is continually added to the virtual environment (at 1760). The system reacts to these updates by iteratively updating the vehicle flock movements, reapplying weights as needed, running the model, and resending instructions to the flock vehicles.

Figure 18:
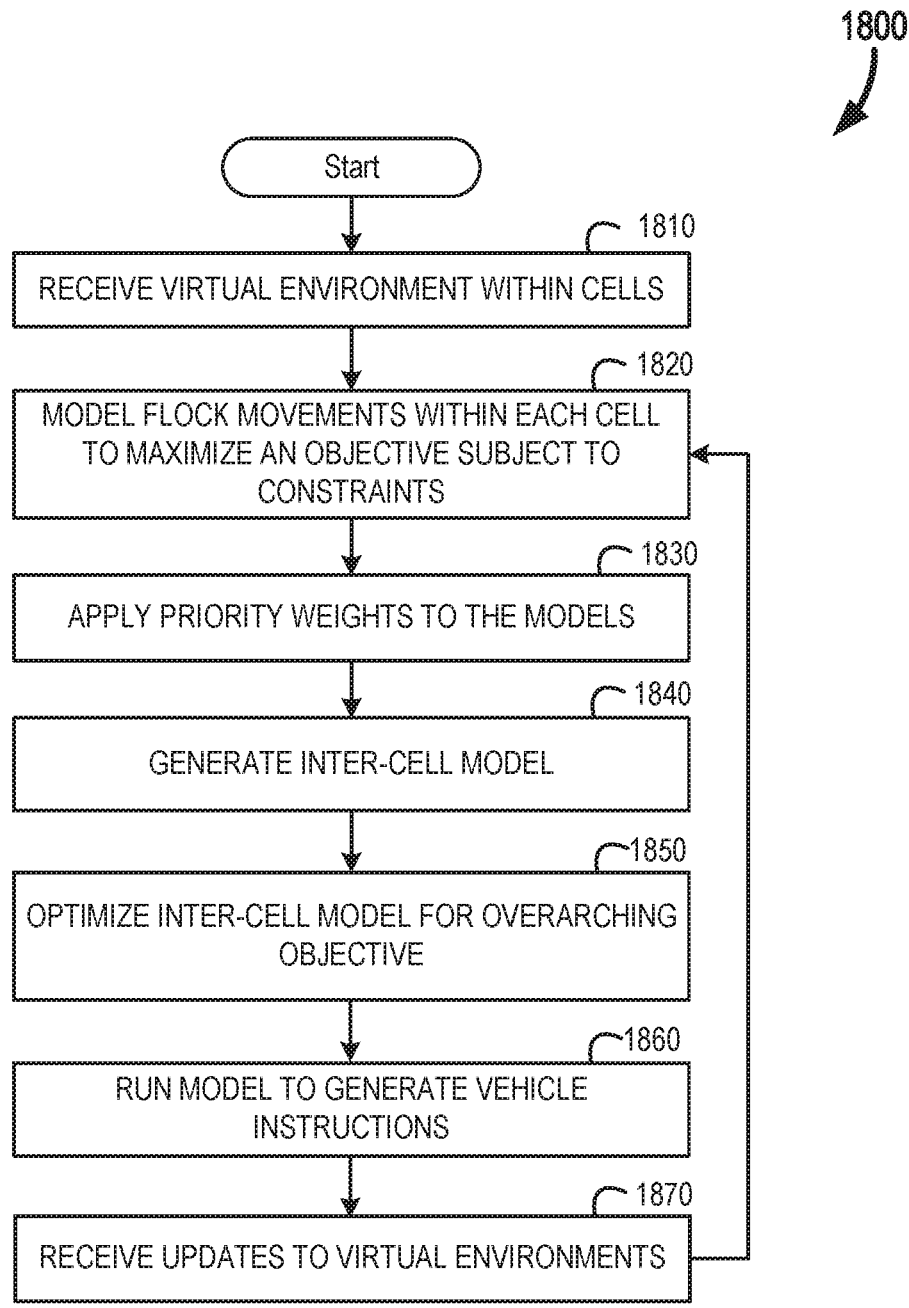
FIG. 18 is a flow diagram for an example process of global traffic optimization for a plurality of vehicle flocks, in accordance with some embodiments.

While such optimizations may benefit a given flock coverage area, there are situations, such as in an urban setting, where even larger "global" optimizations of traffic patterns is desired. FIG. 18 provides a flow diagram of an example process for this global traffic optimization across multiple flock coverage areas, at 1800. As with the single cell optimization, the instant optimization first needs to receive information regarding the environments within each of the cells that are being globally optimized (at 1810). In the manner provided in the previous figure, a model is generated for each individual flock cell (at 1820), where weights are applied to each vehicle across all cells (at 1830). The inputs and outputs of each cell (vehicles which are exiting the cell coverage area and entering another cell) are used to generate an inter-cell model (at 1840). This inter-cell model is a conglomerate of the individual cell level models, accounting for the inputs and outputs across the various cells.

The inter-cell model is then optimized for based upon a total overarching objective (at 1850). In some embodiments the overarching objective may be the same as the cell level objective (e.g., maximization of vehicle throughput). However, it may also be possible that the objectives may differ based upon city objective, and may even differ based upon date or time of day. For example, if a city desires to be a business hub, it may be desirable to favor commuter traffic into and out of the city during rush hour, even if this negatively impacts traffic within the city itself. Likewise, the system may prioritize surge traffic (such as after a football game) in order to resolve congestion problems as quickly as possible.

Based upon the objective, the inter-cell model may be run (at 1860) to optimize for the objective (subject to constraints). As with the above figure, there may be thresholds upon length of delays incurred by a specific vehicle for example. Likewise, as the environments are ever changing, the system continually iterates to ensure that vehicle instructions remain fresh.

It should be noted that vehicle instructions may vary considerably in terms of granularity. At the most basic level, the instructions may simply be to use a specific route, and all other vehicle decisions are made by the vehicle onboard systems. As the models are more accurate (such as when the vast majority of the vehicles on the road are part of the flock) the level of instruction may become far more granular; even to the level of providing instructions as to where and when to allow a merger, which lane to stay in, speeds/accelerations, and the like. In such situations, the onboard systems may be relatively dormant, and merely execute the instructions and react to truly emergency changes in the road conditions.

Figure 19:
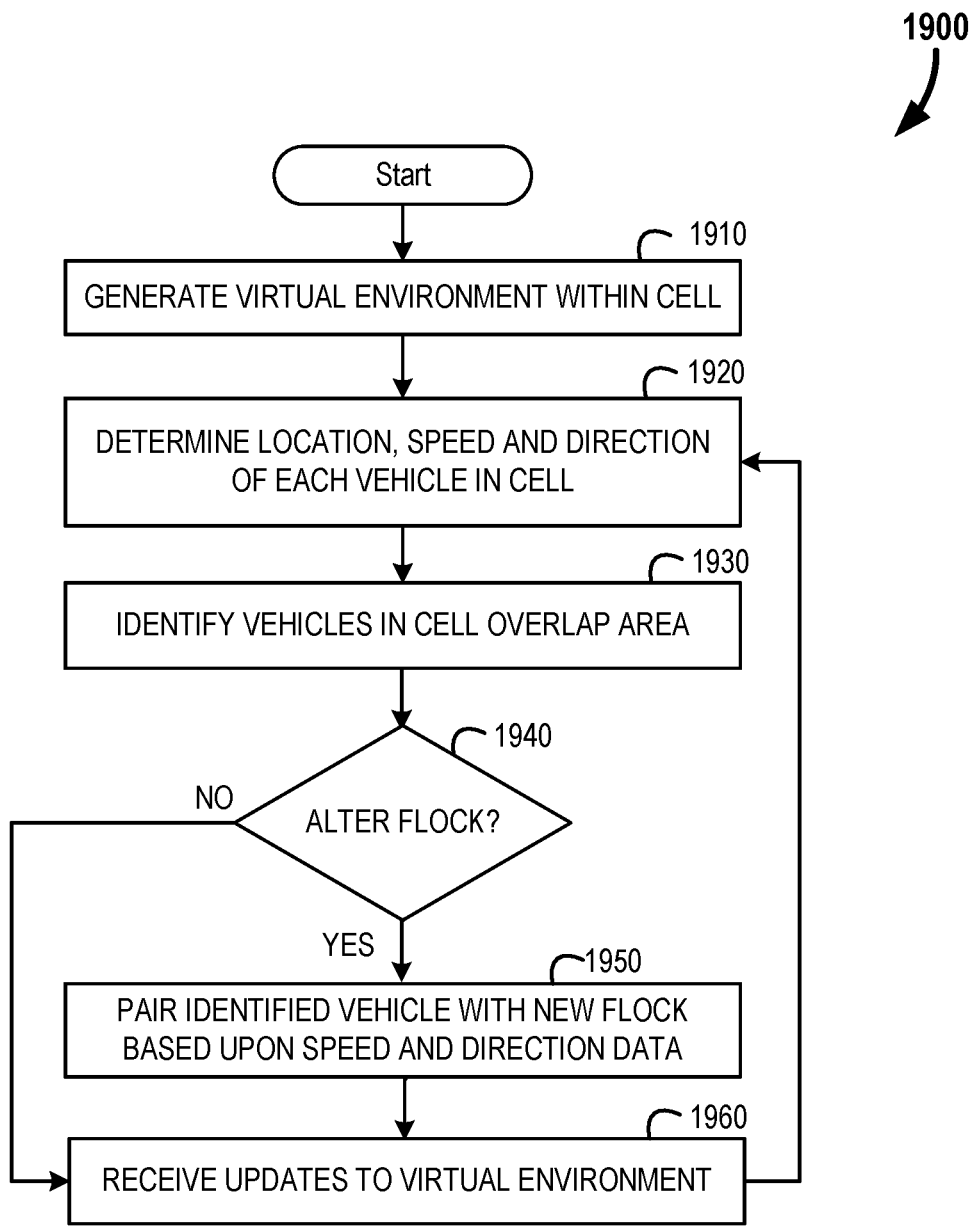
FIG. 19 is a flow diagram for an example process of vehicle handoff between flocks, in accordance with some embodiments.

Turning now to FIG. 19, a flow diagram for the example process for determining which vehicles to include in a flock is described, at 1900. This process likewise benefits with the virtual environment within the cell being available (at 1910). The location, speed and direction of each vehicle within the flock coverage area is identified (at 1920). Vehicles in an overlap region with another flock cell are identified (at 1930). The system must then determine if the flock makeup needs to be altered (at 1940).

Flock membership determinations rely upon to factors: 1) the relative loads between reflectors, and 2) the direction and speed of a vehicle in the overlap region. For example, if one reflector is servicing 500 vehicles, and the other reflector is servicing only a couple dozen, there is a strong motivation to reassign vehicles in the overlap region of these two cells to the underutilized reflector. Similarly, speed and direction of the vehicles is at play. If a vehicle is expected to move outside of the overlap region, then reassigning the vehicle may be advantageous (if entering the flock exclusive area of the new reflector). As such, when it is desirable to reassign a given vehicle to another flock, the assignment is responsive to the relative reflector loads and the speed/direction and known route of the vehicles in the overlap region (at 1950).

Regardless of whether vehicle flock membership is updated or not, the environment is continually changing, resulting in a mirrored change in the virtual environment (at 1960). As such, the process iterates to ensure that the vehicles within the cells are properly assigned.

The above systems and methods utilize a novel mechanism to develop and maintain, in near real-time, a virtual environment which mirrors the real world. This virtual environment is collated from various data sources, allowing the vehicles within the flock to "see" objects and features far beyond their sensory range. This has clear safety ramifications as the autonomous vehicles may proactively respond to road features and hazards. Furthermore, through the usage of traffic flow models, it is possible to optimize for traffic congestion objectives, thereby significantly reducing gridlock and improving travel times.

IV. System Embodiments

Figure 20A:
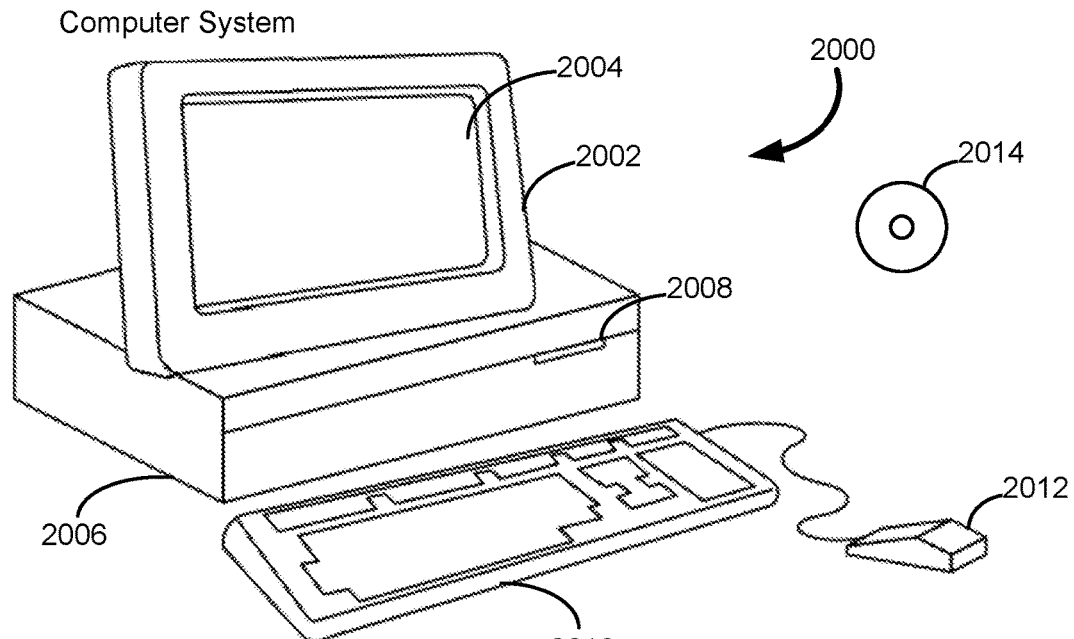
FIGS. 20A and 20B are example illustrations of a computer system capable of embodying the current invention.
Figure 20B:
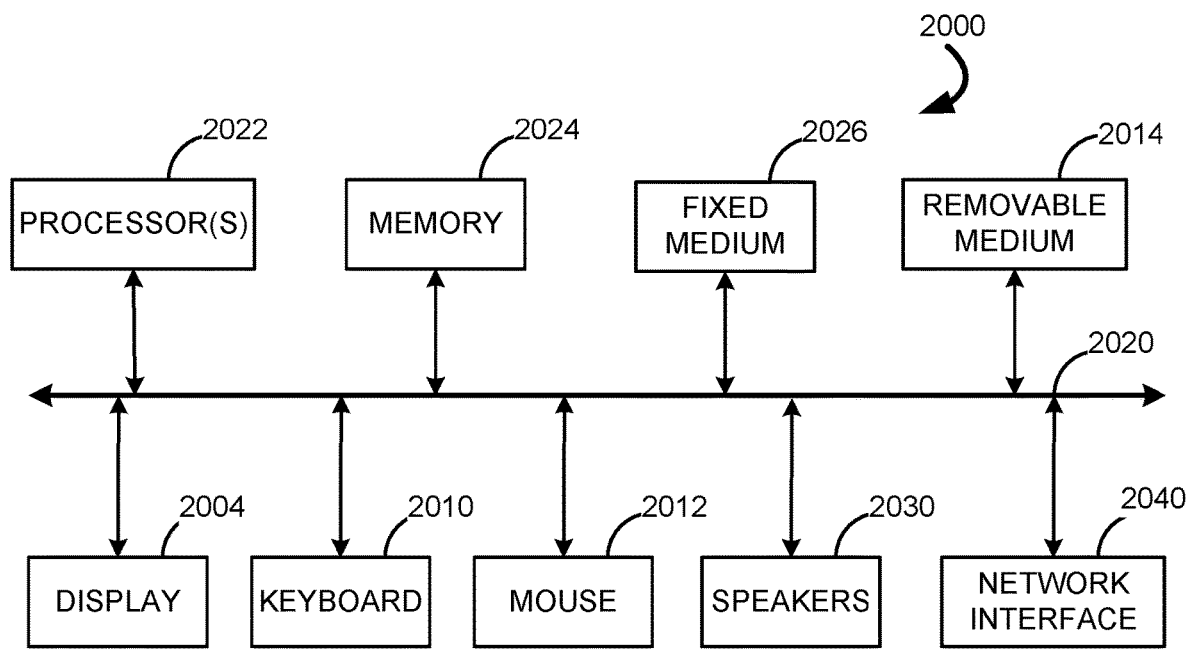

Now that the systems and methods for the collaborative virtual environment for vehicle flocking have been described, attention shall now be focused upon systems capable of executing the above functions. To facilitate this discussion, FIGS. 20A and 20B illustrate a Computer System 2000, which is suitable for implementing embodiments of the present invention. FIG. 20A shows one possible physical form of the Computer System 2000. Of course, the Computer System 2000 may have many physical forms ranging from a printed circuit board, an integrated circuit, and a small handheld device up to a huge super computer. Computer system 2000 may include a Monitor 2002, a Display 2004, a Housing 2006, a Storage Drive 2008, a Keyboard 2010, and a Mouse 2012. Storage 2014 is a computer-readable medium used to transfer data to and from Computer System 2000.

FIG. 20B is an example of a block diagram for Computer System 2000. Attached to System Bus 2020 are a wide variety of subsystems. Processor(s) 2022 (also referred to as central processing units, or CPUs) are coupled to storage devices, including Memory 2024. Memory 2024 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A Fixed Storage 2026 may also be coupled bi-directionally to the Processor 2022; it provides additional data storage capacity and may also include any of the computer-readable media described below. Fixed Storage 2026 may be used to store programs, data, and the like and is typically a secondary storage medium (such as a hard disk) that is slower than primary storage. It will be appreciated that the information retained within Fixed Storage 2026 may, in appropriate cases, be incorporated in standard fashion as virtual memory in Memory 2024. Removable Storage 2014 may take the form of any of the computer-readable media described below.

Processor 2022 is also coupled to a variety of input/output devices, such as Display 2004, Keyboard 2010, Mouse 2012 and Speakers 2030. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, motion sensors, brain wave readers, or other computers. Examples of typical input/output devices that are particularly relevant to a virtual 3D environment being proposed may include direct interfaces to the autonomous vehicle piloting software, and to displays for the drivers and passengers of flock capable vehicles.

Processor 2022 optionally may be coupled to another computer or telecommunications network using Network Interface 2040. With such a Network Interface 2040, it is contemplated that the Processor 2022 might receive information from the network or might output information to the network in the course of performing the above-described virtual environments. Furthermore, method embodiments of the present invention may execute solely upon Processor 2022 or may execute over a network such as the Internet or a wireless network (e.g., a cellular network) in conjunction with a remote CPU that shares a portion of the processing.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this disclosure. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

In operation, the computer system 2000 can be controlled by operating system software that includes a file management system, such as a storage operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is, here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

The algorithms and displays presented herein are not inherently related to any particular computer or other apparatus. Various general-purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may, thus, be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a virtual machine, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure may be implemented as part of an operating system or a specific application, component, program, object, module or sequence of instructions referred to as "computer programs." The computer programs typically comprise one or more instructions set at various times in various memory and storage devices in a computer, and when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

While this invention has been described in terms of several embodiments, there are alterations, modifications, permutations, and substitute equivalents, which fall within the scope of this invention. Although sub-section titles have been provided to aid in the description of the invention, these titles are merely illustrative and are not intended to limit the scope of the present invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method for optimizing traffic flow comprising:
generating a vehicle flock within a coverage area of a lightweight server system located distributed around an environment functioning as a time keeper, known as a reflector, defining a traffic objective for the vehicle flock, wherein the traffic objective is to maximize vehicle throughput, wherein the vehicle throughput is number of vehicles passing through a given traffic channel, and wherein the reflector replicates a virtual environment using collected sensory data and non-vehicle data at a local computational device on each of a flock of vehicles via the transmission of messages through the reflector replicating islands including a plurality of objects across at least two local machines;
assigning mathematical weight values to each vehicle within the flock;
modeling traffic within the vehicle flock responsive to the weight values and the objective; and
providing vehicle instructions to the vehicles within the flock.

2. The method of claim 1, wherein the sensory data includes radar, light detection and ranging (LiDAR), optical sensory data, and vehicle data, wherein the vehicle data includes position, speed and acceleration of each of the subset of vehicles.

3. The method of claim 1, wherein the non-vehicle data includes at least one of road condition data, weather data, time of day, accident data, construction data and event data.

4. The method of claim 1, wherein the flock of vehicles are autonomous vehicles.

5. The method of claim 1, wherein the model is a fluid dynamics model.

6. The method of claim 1, wherein the model is a deep learning based model.

7. The method of claim 1, wherein the weight values are equal across all vehicles in the flock.

8. The method of claim 1, wherein the weight values are different for vehicles within the flock, and wherein vehicles with higher weights are preferentially treated.

9. The method of claim 8, wherein emergency vehicles are assigned a higher weight values.

10. The method of claim 8, wherein at least one of a high occupancy vehicle, a fee based vehicle, and a credit based vehicle is assigned a higher weight values.

* * * * *